(12) United States Patent
Matsukura

(10) Patent No.: US 10,504,920 B2
(45) Date of Patent: Dec. 10, 2019

(54) SEMICONDUCTOR DEVICE

(75) Inventor: Hideki Matsukura, Isehara (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 13/482,349

(22) Filed: May 29, 2012

(65) Prior Publication Data

US 2012/0305996 A1  Dec. 6, 2012

(30) Foreign Application Priority Data

Jun. 1, 2011 (JP) .................. 2011-123521

(51) Int. Cl.
- *H01L 29/94* (2006.01)
- *H01L 27/12* (2006.01)
- *H01L 27/06* (2006.01)

(52) U.S. Cl.
CPC ...... *H01L 27/1203* (2013.01); *H01L 27/1255* (2013.01); *H01L 27/0629* (2013.01)

(58) Field of Classification Search
CPC .............. H01L 27/1214; H01L 27/0629; H01L 27/1203; H01L 27/1255; G02F 1/136213
USPC ........................................................ 257/296
See application file for complete search history.

(56) References Cited

U.S. PATENT DOCUMENTS

| | | | |
|---|---|---|---|
| 5,530,274 A | 6/1996 | Fujioka | |
| 5,840,615 A * | 11/1998 | Aoki | C23C 18/1216 257/E21.009 |
| 5,940,705 A | 8/1999 | Lee et al. | |
| 6,100,591 A | 8/2000 | Ishii | |
| 6,583,492 B2 | 6/2003 | Otsuki | |
| 7,129,917 B2 | 10/2006 | Yamazaki et al. | |
| 8,492,806 B2 | 7/2013 | Yamazaki et al. | |
| 8,791,456 B2 | 7/2014 | Yamazaki et al. | |
| 9,117,713 B2 | 8/2015 | Koyama | |
| 9,385,114 B2 | 7/2016 | Yamazaki et al. | |
| 2004/0178436 A1* | 9/2004 | Baniecki | H01L 27/0805 257/310 |
| 2006/0050035 A1* | 3/2006 | Leo | G09G 3/3655 345/89 |
| 2006/0216877 A1* | 9/2006 | Toyota | G02F 1/136213 438/149 |
| 2007/0108446 A1* | 5/2007 | Akimoto | H01L 29/41733 257/61 |
| 2008/0272703 A1* | 11/2008 | Chan | H01L 27/3265 315/169.2 |

(Continued)

FOREIGN PATENT DOCUMENTS

| | | |
|---|---|---|
| JP | 62-274773 A | 11/1987 |
| JP | 05-282862 A | 10/1993 |

(Continued)

*Primary Examiner* — Meiya Li
(74) *Attorney, Agent, or Firm* — Robinson Intellectual Property Law Office; Eric J. Robinson

(57) ABSTRACT

An area occupied by a circuit element having at least a capacitor and a transistor is reduced in a semiconductor device. In a semiconductor device including a first transistor, a second transistor, and a capacitor, the first transistor and the capacitor are provided over the second transistor. Then, a common electrode, which serves as one of a source and a drain of the first transistor and one electrode of the capacitor, is provided. In addition, the other electrode of the capacitor is provided over the common electrode.

13 Claims, 29 Drawing Sheets

(56) References Cited

U.S. PATENT DOCUMENTS

| | | | |
|---|---|---|---|
| 2009/0078939 A1* | 3/2009 | Yamazaki | H01L 21/67144 257/59 |
| 2011/0101339 A1 | 5/2011 | Yamazaki et al. | |
| 2011/0101351 A1 | 5/2011 | Yamazaki | |
| 2011/0108706 A1* | 5/2011 | Koyama | H01L 27/14612 250/208.1 |
| 2011/0147737 A1 | 6/2011 | Yamazaki et al. | |
| 2013/0146931 A1* | 6/2013 | Liu | H01L 27/0688 257/99 |
| 2014/0246670 A1 | 9/2014 | Koyama | |

FOREIGN PATENT DOCUMENTS

| | | |
|---|---|---|
| JP | 07-263638 A | 10/1995 |
| JP | 10-209389 A | 8/1998 |
| JP | 11-233789 A | 8/1999 |
| JP | 11-340418 A | 12/1999 |
| JP | 2001-053164 A | 2/2001 |
| JP | 2001-318627 A | 11/2001 |
| JP | 2003-100887 A | 4/2003 |
| JP | 2008-022610 A | 1/2008 |
| JP | 2008-083171 A | 4/2008 |
| JP | 2009-094492 A | 4/2009 |
| JP | 2011-077106 A | 4/2011 |
| JP | 2011-119673 A | 6/2011 |
| JP | 2011-171702 A | 9/2011 |
| WO | WO-2011/052396 | 5/2011 |
| WO | WO-2011/052437 | 5/2011 |
| WO | WO-2011/055625 | 5/2011 |

* cited by examiner

SEMICONDUCTOR DEVICE

BACKGROUND OF THE INVENTION

1. Field of the Invention

The field of the invention relates to a semiconductor device in general including a circuit element having at least a capacitor and a transistor.

2. Description of the Related Art

Patent Document 1 discloses a pixel circuit of an EL display device including a circuit element having one capacitor and two transistors.

In Patent Document 1, one of the two transistors has a function of controlling whether or not electric charge is accumulated in the capacitor.

In Patent Document 1, the capacitor has a function of supplying the accumulated electric charge to the other of the two transistors.

Such a circuit element disclosed in Patent Document 1 is used for a variety of kinds of circuits such as a memory circuit, a current mirror circuit, a pixel circuit of a liquid crystal display device, and a boosting circuit, as well as the pixel circuit of an EL display device.

REFERENCE

[Patent Document 1] Japanese Published Patent Application No. 2001-318627

SUMMARY OF THE INVENTION

A first object is to reduce an area occupied by a circuit element having at least one capacitor and two transistors in a semiconductor device.

A second object is to reduce an area occupied by a circuit element having at least one capacitor and one transistor in a semiconductor device.

The invention to be disclosed below achieves at least one of the first object and the second object.

To achieve the first object, in a semiconductor device including at least a first transistor, a second transistor, and a capacitor, the first transistor and the capacitor are provided over the second transistor.

Then, a common electrode, which serves as one of a source and a drain of the first transistor and one electrode of the capacitor, is provided.

In addition, the other electrode of the capacitor is provided over the common electrode.

With the above structure, part of the first transistor and part of the second transistor overlap with each other, and part of the first transistor and part of the capacitor overlap with each other; thus, the first object can be achieved.

To achieve the second object, in a semiconductor device including at least a transistor and a capacitor, a common electrode, which serves as one of a source and a drain of the transistor and one electrode of the capacitor, is provided.

In addition, the other electrode of the capacitor is provided over the common electrode.

With the above structure, part of the transistor and part of the capacitor overlap with each other; thus, the second object can be achieved.

That is, a semiconductor device including a first transistor, a second transistor, and a capacitor can be provided. One of a source and a drain of the first transistor is electrically connected to a gate of the second transistor. The first transistor and the capacitor are provided over the second transistor. The semiconductor device includes a common electrode which serves as the one of the source and the drain of the first transistor and one electrode of the capacitor. The other electrode of the capacitor is provided over the common electrode.

Further, the semiconductor device in which the common electrode is electrically connected to the gate of the second transistor through an opening portion provided in a semiconductor layer of the first transistor can be provided.

A semiconductor device including a first transistor, a second transistor, and a capacitor can be provided. One of a source and a drain of the first transistor is electrically connected to one of a source and a drain of the second transistor. The first transistor and the capacitor are provided over the second transistor. The semiconductor device includes a common electrode which serves as the one of the source and the drain of the first transistor and one electrode of the capacitor. The other electrode of the capacitor is provided over the common electrode.

Further, the semiconductor device in which the common electrode is electrically connected to the one of the source and the drain of the second transistor through an opening portion provided in a semiconductor layer of the first transistor can be provided.

Furthermore, the semiconductor device in which the semiconductor layer of the first transistor and a semiconductor layer of the second transistor overlap with each other can be provided.

In addition, the semiconductor device in which a gate of the first transistor is electrically connected to the common electrode using a wiring provided over the other electrode of the capacitor, and the wiring is electrically connected to the common electrode through an opening portion provided in the other electrode of the capacitor can be provided.

A semiconductor device including a transistor and a capacitor can be provided. The semiconductor device includes a common electrode which serves as one of a source and a drain of the transistor and one electrode of the capacitor. The other electrode of the capacitor is provided over the common electrode. A gate of the transistor is electrically connected to the common electrode using a wiring provided over the other electrode of the capacitor. The wiring is electrically connected to the common electrode through an opening portion provided in the other electrode of the capacitor.

When three elements (one capacitor and two transistors) are stacked, in a semiconductor device, an area occupied by a cell in which the three elements (one capacitor and two transistors) are provided can be reduced.

When two elements (one capacitor and one transistor) are stacked, in a semiconductor device, an area occupied by a cell in which the two elements (one capacitor and one transistor) are provided can be reduced.

DETAILED DESCRIPTION OF THE INVENTION

Figure 1A:
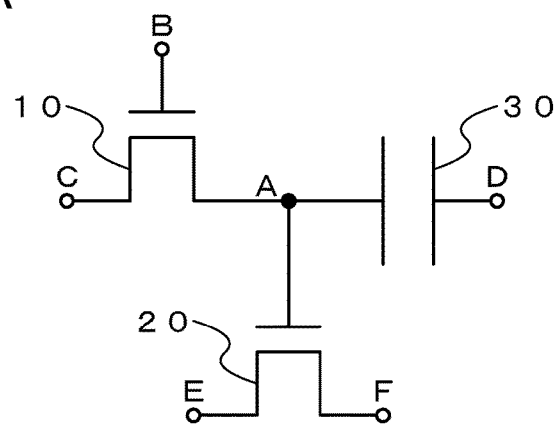
FIGS. 1A and 1B illustrate an example of a semiconductor device including a circuit element having at least one capacitor and two transistors.

Embodiments and an example will be described with reference to the drawings.

It is easily understood by those skilled in the art that modes and details thereof can be modified in various ways without departing from the spirit and scope of the present invention.

Thus, the present invention should not be interpreted as being limited to what is described in the embodiments described below.

In the structures to be given below, the same portions or portions having similar functions are denoted by the same reference numerals in different drawings, and explanation thereof will not be repeated.

The following embodiments can be combined with each other, as appropriate.

Embodiment 1

Figure 1B:
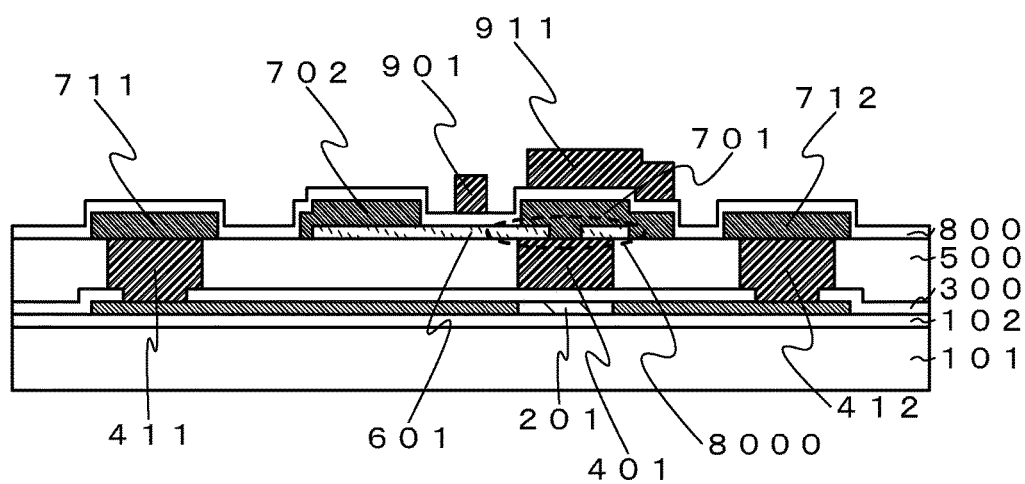

FIGS. 1A and 1B illustrate an example of a semiconductor device including a circuit element having at least one capacitor and two transistors.

A semiconductor device illustrated in FIG. 1A includes a circuit element having at least a transistor 10, a transistor 20, and a capacitor 30.

A node A is electrically connected to one of a source and a drain of the transistor 10, a gate of the transistor 20, and one electrode of the capacitor 30.

In other words, the one of the source and the drain of the transistor 10 is electrically connected to the gate of the transistor 20 and the one electrode of the capacitor 30.

A node B is electrically connected to a gate of the transistor 10.

A node C is electrically connected to the other of the source and the drain of the transistor 10.

A node D is electrically connected to the other electrode of the capacitor 30.

A node E is electrically connected to one of a source and a drain of the transistor 20.

A node F is electrically connected to the other of the source and the drain of the transistor 20.

FIG. 1B is an example of a cross-sectional view of the semiconductor device illustrated in FIG. 1A.

In FIG. 1B, an insulating layer 102 is provided over a substrate 101.

A semiconductor layer 201, an insulating layer 300 over the semiconductor layer 201, and a conductive layer 401 over the insulating layer 300 are provided over the insulating layer 102.

The semiconductor layer 201, the insulating layer 300, and the conductive layer 401 respectively correspond to a semiconductor layer, a gate insulating layer, and a gate electrode (gate wiring) of the transistor 20 in FIG. 1A.

Since the conductive layer 401 is the gate electrode (gate wiring), at least part of the conductive layer 401 overlaps with a channel formation region of the semiconductor layer 201.

A plurality of opening portions is provided in the insulating layer 300.

Further, a conductive layer 411 and a conductive layer 412 are provided over the insulating layer 300. The conductive layer 411 and the conductive layer 412 are electrically connected to the semiconductor layer 201 through the opening portions provided in the insulating layer 300.

The conductive layer 411 is a connection electrode (connection wiring) and is electrically connected to one of a source region and a drain region in the semiconductor layer 201.

The conductive layer 412 is a connection electrode (connection wiring) and is electrically connected to the other of the source region and the drain region in the semiconductor layer 201.

In view of reducing the number of steps, the conductive layer 411 and the conductive layer 412 are preferably formed through the same step (of the same material, from the same starting film) as the conductive layer 401.

An insulating layer 500 is embedded between the gate electrode and the connection electrodes.

The insulating layer 500 can be formed in the following manner: an insulating layer is formed over the entire surface and then the insulating layer formed over the entire surface is subjected to etch-back or polishing (e.g., mechanical polishing or chemical mechanical polishing (CMP)).

When the insulating layer 500 is embedded between the gate electrode and the connection electrodes, the top surface (surface) of the gate electrode and the top surfaces (surfaces) of the connection electrodes can be exposed without forming a contact hole; thus, the number of masks can be reduced.

Note that the following process may be employed: after the insulating layer 500 provided with a plurality of opening portions is formed, conductive layers are embedded in the opening portions, so that the conductive layer 401, the conductive layer 411, and the conductive layer 412 are formed.

A semiconductor layer 601 having an opening portion is provided over the insulating layer 500 and the conductive layer 401.

The semiconductor layer 601 corresponds to a semiconductor layer of the transistor 10 in FIG. 1A.

The semiconductor layer 601 is electrically connected to the conductive layer 401. In this embodiment, the semiconductor layer 601 is in contact with the conductive layer 401.

A conductive layer 701 and a conductive layer 702 are provided over the semiconductor layer 601.

The conductive layer 701 is a common electrode which serves as one of a source electrode (source wiring) and a drain electrode (drain wiring) of the transistor 10 in FIG. 1A and the one electrode of the capacitor 30 in FIG. 1A.

When the conductive layer 701 (common electrode) is provided on and in contact with the semiconductor layer 601 as illustrated in FIG. 1B, low contact resistance between the conductive layer 701 (common electrode) and the semiconductor layer 601 can be obtained.

With the low contact resistance between the conductive layer 701 (common electrode) and the semiconductor layer 601, low resistance between the node A and the capacitor 30 in FIG. 1A is obtained; thus, charge accumulation in the capacitor 30 can be performed quickly.

When the charge accumulation in the capacitor 30 can be performed quickly, the operation speed of a circuit can be improved.

The conductive layer 701 (common electrode) is electrically connected to the conductive layer 401 through an opening portion provided in the semiconductor layer 601.

The number of the opening portions provided in the semiconductor layer 601 may be one; however, a plurality of the opening portions is preferably provided in the semiconductor layer 601, in which case the number of connection portions between the conductive layer 701 (common electrode) and the conductive layer 401 is increased.

When the number of the connection portions between the conductive layer 701 (common electrode) and the conductive layer 401 is increased, low contact resistance between the conductive layer 701 (common electrode) and the conductive layer 401 can be obtained.

The conductive layer 702 corresponds to the other of the source electrode (source wiring) and the drain electrode (drain wiring) of the transistor 10 in FIG. 1A.

A conductive layer 711 which is electrically connected to the conductive layer 411 is provided over the insulating layer 500 and the conductive layer 411.

A conductive layer 712 which is electrically connected to the conductive layer 412 is provided over the insulating layer 500 and the conductive layer 412.

Each of the conductive layer 711 and the conductive layer 712 is an electrode or a wiring.

In view of reducing the number of steps, the conductive layer 701, the conductive layer 702, the conductive layer 711, and the conductive layer 712 are preferably formed through the same step.

An insulating layer 800 is provided over the conductive layer 701, the conductive layer 702, the conductive layer 711, and the conductive layer 712.

The insulating layer 800 corresponds to a gate insulating layer of the transistor 10 in FIG. 1A. The insulating layer 800 also corresponds to a dielectric layer of the capacitor 30 in FIG. 1A.

The gate insulating layer of the transistor 10 and the dielectric layer of the capacitor 30 may be formed through different steps.

However, in view of reducing the number of steps, the gate insulating layer of the transistor 10 and the dielectric layer of the capacitor 30 are preferably formed through the same step as illustrated in FIG. 1B.

A conductive layer 901 and a conductive layer 911 are provided over the insulating layer 800.

The conductive layer 901 corresponds to a gate electrode (gate wiring) of the transistor 10 in FIG. 1A.

The conductive layer 911 corresponds to the other electrode of the capacitor 30 in FIG. 1A.

Since the conductive layer 901 is the gate electrode (gate wiring), at least part of the conductive layer 901 overlaps with a channel formation region of the semiconductor layer 601.

As described above, when three elements (one capacitor and two transistors) are stacked, in a semiconductor device, an area occupied by a cell in which the three elements (one capacitor and two transistors) are provided can be reduced.

Figure 2A:
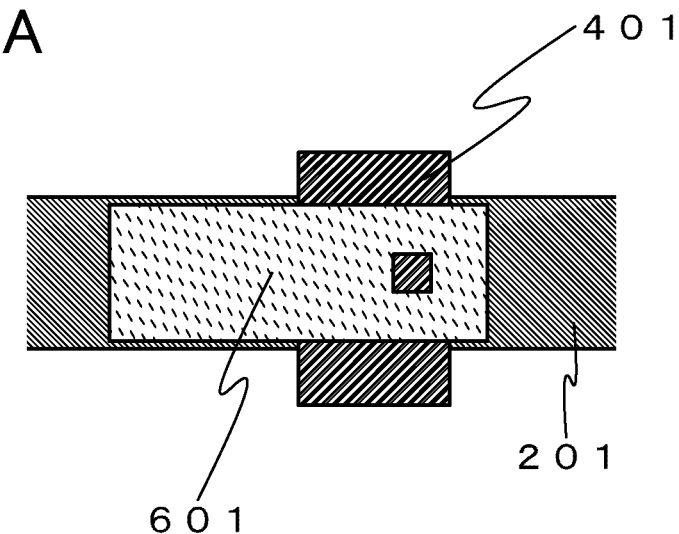
FIGS. 2A and 2B each illustrate an example of a positional relation of a semiconductor layer 201, a conductive layer 401, and a semiconductor layer 601.
Figure 2B:
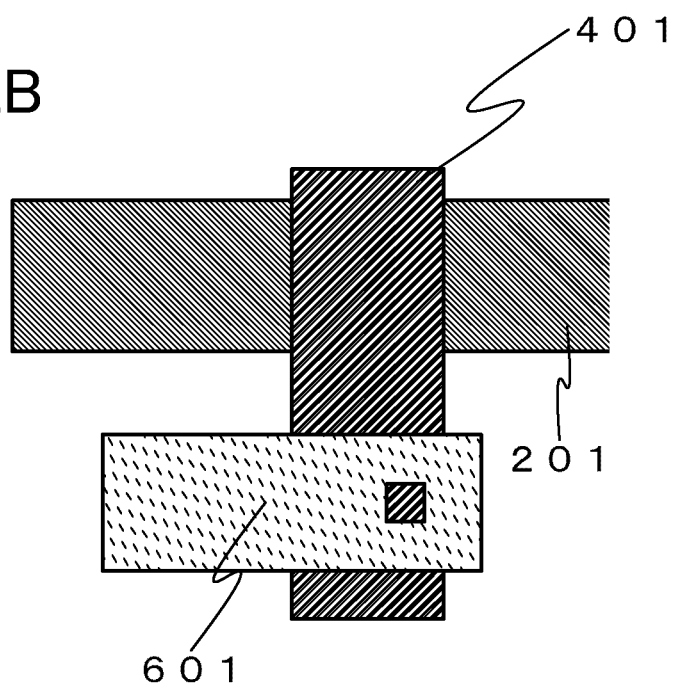

FIGS. 2A and 2B each illustrate an example of a positional relation of the semiconductor layer 201, the conductive layer 401, and the semiconductor layer 601.

In FIG. 2A, at least part of the semiconductor layer 201, part of the conductive layer 401, and part of the semiconductor layer 601 are provided so as to overlap with each other.

In FIG. 2B, at least part of the semiconductor layer 201 overlaps with at least part of the conductive layer 401 and at least part of the semiconductor layer 601 overlaps with at least part of the conductive layer 401. Further, the semiconductor layer 201 is provided so as not to overlap with the semiconductor layer 601.

As illustrated in FIGS. 2A and 2B, when the semiconductor layer 201 and the semiconductor layer 601 overlap with the conductive layer 401, an area of a cell in which three elements are provided can be reduced.

When FIG. 2A and FIG. 2B are compared, the case of FIG. 2A is preferable because the area in which the three elements are provided can be further reduced in the case of FIG. 2A.

Figure 3A:
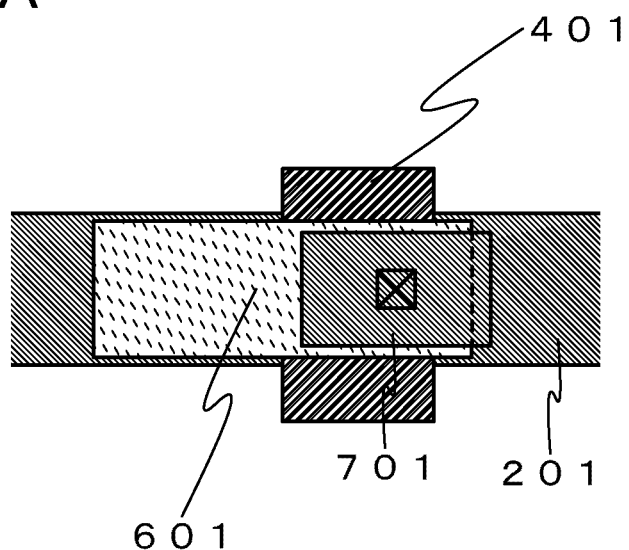
FIGS. 3A and 3B each illustrate an example of a positional relation of the semiconductor layer 201, the conductive layer 401, the semiconductor layer 601, and a conductive layer 701.
Figure 3B:
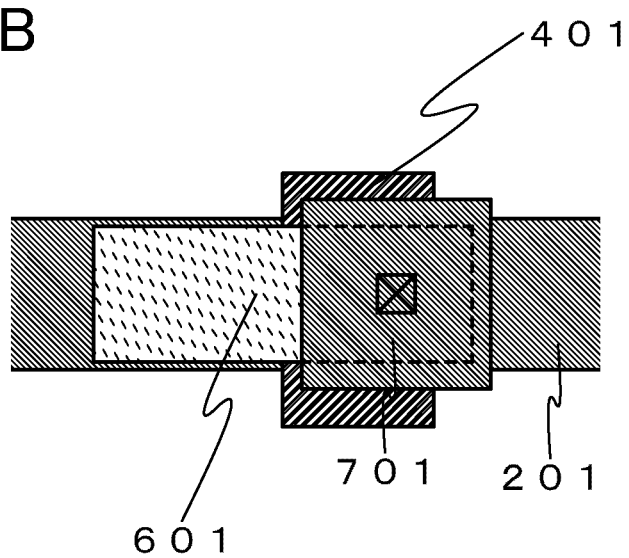

FIGS. 3A and 3B each illustrate an example of a positional relation of the semiconductor layer 201, the conductive layer 401, the semiconductor layer 601, and the conductive layer 701.

Although FIGS. 3A and 3B illustrate the case where the conductive layer 701 is provided in the case of FIG. 2A, the conductive layer 701 in FIG. 3A or FIG. 3B may be provided in the case of FIG. 2B.

FIG. 3A illustrates an example where the conductive layer 401 is in contact with the conductive layer 701 only in the opening portion provided in the semiconductor layer 601.

On the other hand, FIG. 3B illustrates an example where the conductive layer 701 is extended to the outside of the semiconductor layer 601 so that the conductive layer 401 is in contact with the conductive layer 701 outside the semiconductor layer 601 and in the opening portion provided in the semiconductor layer 601.

When FIG. 3A and FIG. 3B are compared, the case of FIG. 3B is preferable because the area where the conductive layer 401 is in contact with the conductive layer 701 can be further increased in the case of FIG. 3B.

When the area where the conductive layer 401 is in contact with the conductive layer 701 can be increased, low contact resistance between the conductive layer 401 and the conductive layer 701 can be obtained.

The contents of this embodiment or part thereof can be implemented in combination with any of the other embodiments and an example.

Embodiment 2

As shown by a dashed line 8000 in FIG. 1B, the conductive layer 401 is electrically connected to the conductive layer 701 through an opening portion in FIG. 1B.

Figure 4:
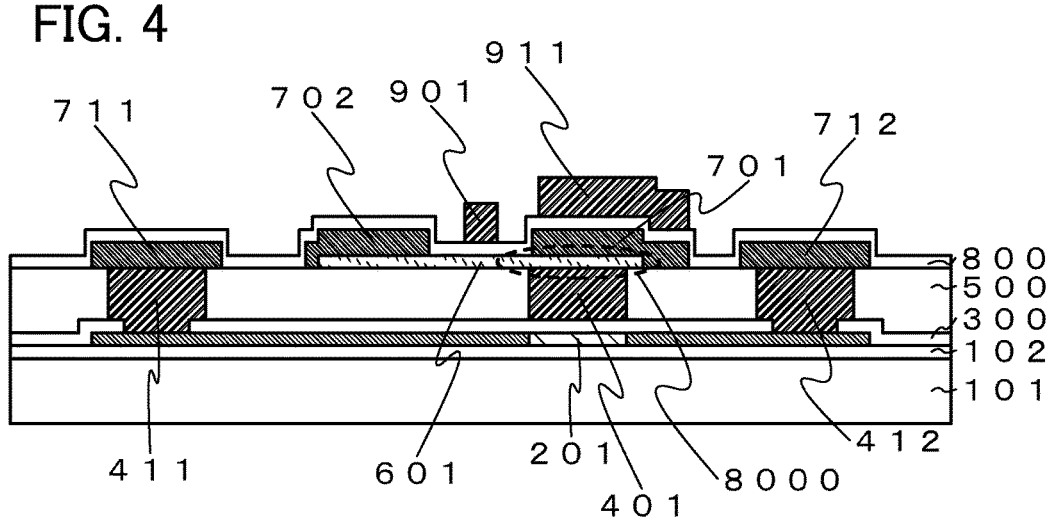
FIG. 4 illustrates an example of a semiconductor device including a circuit element having at least one capacitor and two transistors.

Meanwhile, as shown by the dashed line 8000 in FIG. 4, an opening portion is not necessarily provided in the semiconductor layer 601 and the conductive layer 401 may be electrically connected to the conductive layer 701 through the semiconductor layer 601.

Figure 5A:
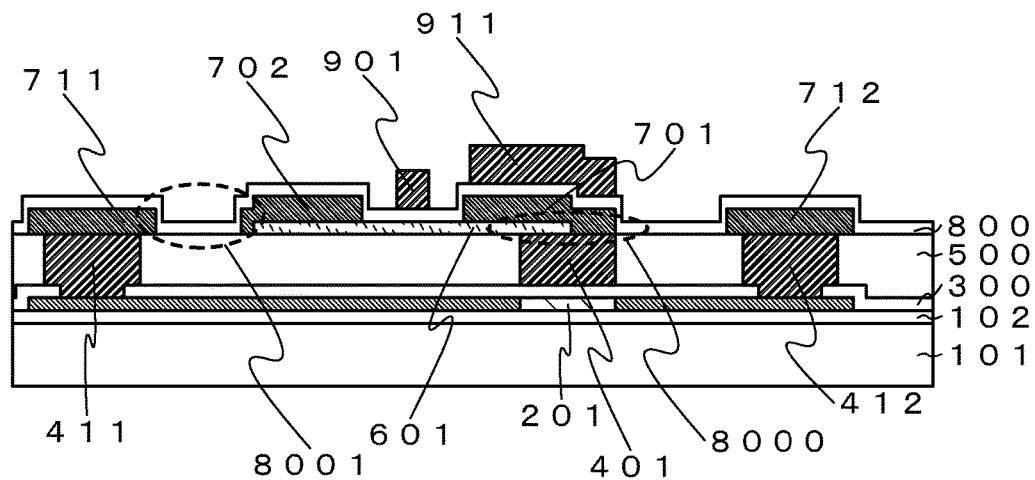
FIGS. 5A and 5B each illustrate an example of a semiconductor device including a circuit element having at least one capacitor and two transistors.
Figure 5B:
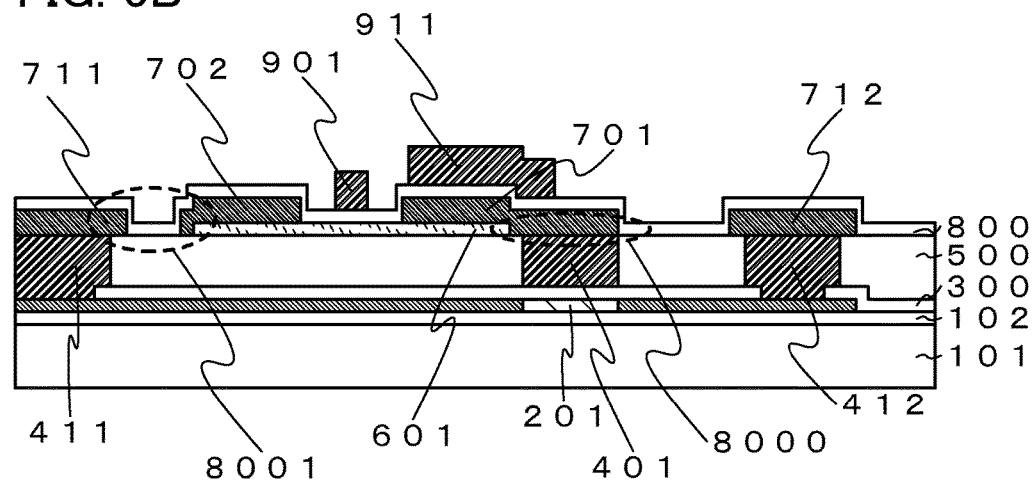

Alternatively, as shown by the dashed line 8000 in FIGS. 5A and 5B, an opening portion is not necessarily provided in the semiconductor layer 601 and the conductive layer 401 may be electrically connected to the conductive layer 701 outside the semiconductor layer 601.

However, since a semiconductor has high resistance, resistance between the conductive layer 401 and the conductive layer 701 is increased with the structure in FIG. 4.

Accordingly, the conductive layer 401 is preferably in direct contact with the conductive layer 701 as in FIG. 1B and FIGS. 5A and 5B for a reliable connection between the conductive layer 401 and the conductive layer 701.

When the conductive layer 401 is electrically connected to the conductive layer 701 outside the semiconductor layer 601 as in FIGS. 5A and 5B, the distance between the conductive layer 711 and the conductive layer 702 is decreased as shown by a dashed line 8001 in FIGS. 5A and 5B.

When the distance between the conductive layers is decreased, an effect of dust or the like results in a short circuit between the conductive layers in some cases. Thus, the distance between the conductive layers needs to have a certain distance therebetween.

In view of the above, an area of the semiconductor layer 201 in FIGS. 5A and 5B is larger than that in FIG. 1B.

Thus, when the conductive layer 401 is electrically connected to the conductive layer 701 outside the semiconductor layer 601 as in FIGS. 5A and 5B, an area of a cell in which three elements are provided is slightly increased as compared to the case in FIG. 1B.

As a result, a structure in which an opening portion is provided in the semiconductor layer 601 as in FIG. 1B is the best structure of the structures in FIG. 1B, FIG. 5A, and FIG. 5B in that the conductive layer 401 can be reliably connected to the conductive layer 701 and the area of the cell in which the three elements are provided can be reduced.

The contents of this embodiment or part thereof can be implemented in combination with any of the other embodiments and an example.

Embodiment 3

A structure in which the insulating layer 500 is embedded between the gate electrode and the connection electrodes is described in other embodiments; however, the structure is not an essential structure.

Figure 6:
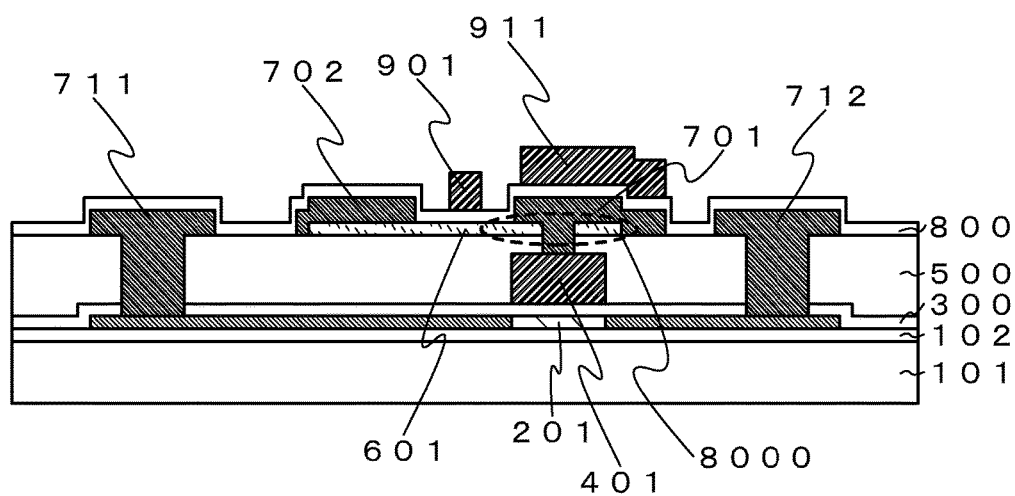
FIG. 6 illustrates an example of a semiconductor device including a circuit element having at least one capacitor and two transistors.

For example, as in FIG. 6, the insulating layer 500 may be formed so as to cover the conductive layer 401 and a plurality of contact holes may be provided in the insulating layer 500, whereby elements may be electrically connected to each other.

Note that in FIG. 6, the conductive layer 401 is electrically connected to the conductive layer 701 through the opening portion provided in the semiconductor layer 601 and a contact hole provided in the insulating layer 500.

Further, one of the source region and the drain region in the semiconductor layer 201 is electrically connected to the conductive layer 711 through the contact hole provided in the insulating layer 500 in FIG. 6.

Furthermore, the other of the source region and the drain region in the semiconductor layer 201 is electrically connected to the conductive layer 712 through the contact hole provided in the insulating layer 500 in FIG. 6.

The contents of this embodiment or part thereof can be implemented in combination with any of the other embodiments and an example.

Embodiment 4

The case where the transistor 10 and the transistor 20 are top-gate transistor is described in other embodiments; however, the transistor 10 or the transistor 20 may be a bottom-gate transistor.

Figure 7A:
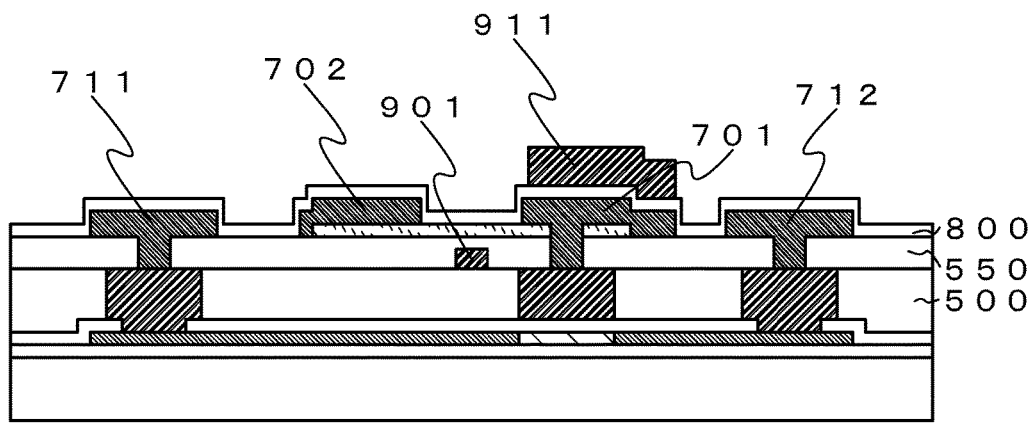
FIGS. 7A and 7B each illustrate an example of a semiconductor device including a circuit element having at least one capacitor and two transistors.

For example, FIG. 7A illustrates the case where the transistor 10 is a bottom-gate transistor.

FIG. 7A differs from FIG. 1B in that an insulating layer 550 is provided between the insulating layer 500 and the semiconductor layer 601 and the conductive layer 901 is provided between the insulating layer 550 and the insulating layer 500.

Note that although the insulating layer 800 corresponds to the gate insulating layer of the transistor 10 in FIG. 1B, the insulating layer 550 corresponds to the gate insulating layer of the transistor 10 in FIG. 7A.

Figure 7B:
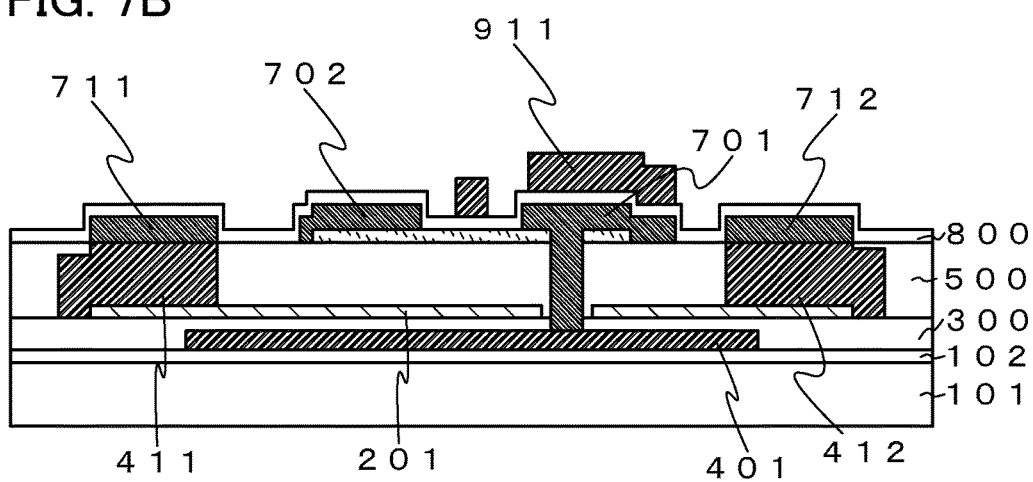

FIG. 7B illustrates the case where the transistor 20 is a bottom-gate transistor.

FIG. 7B differs from FIG. 1B in that the insulating layer 300 is provided between the semiconductor layer 201 and the insulating layer 102 and the conductive layer 401 is provided between the insulating layer 300 and the insulating layer 102.

Further, in FIG. 7B, the conductive layer 401 is electrically connected to the conductive layer 701 through the contact hole provided in the insulating layer 500, the opening portion provided in the semiconductor layer 201, and a contact hole provided in the insulating layer 300.

As illustrated in FIG. 7B, the conductive layer 701 can be in contact with the conductive layer 401 through the opening portion provided in the semiconductor layer 201 without being in contact with the semiconductor layer 201.

Note that the opening portion provided in the semiconductor layer 201 is preferably slightly larger than the contact hole provided in the insulating layer 500 and the contact hole provided in the insulating layer 300 so that the conductive layer 701 is not in contact with the semiconductor layer 201.

Note that the transistor 10 and the transistor 20 may be bottom-gate transistors.

The contents of this embodiment or part thereof can be implemented in combination with any of the other embodiments and an example.

Embodiment 5

An example where a semiconductor layer of the transistor 20 is provided over the substrate is described in other embodiments; however, the transistor 20 may be formed using a semiconductor substrate (e.g., a silicon wafer).

The contents of this embodiment or part thereof can be implemented in combination with any of the other embodiments and an example.

Embodiment 6

An example where the node A is electrically connected to the gate of the transistor 20 is described in Embodiment 1. In this embodiment, an example where the node A is electrically connected to the other of the source and the drain of the transistor 20 (the node F in FIG. 1A) will be described with reference to FIGS. 8A and 8B and FIGS. 9A to 9C.

Figure 8A:
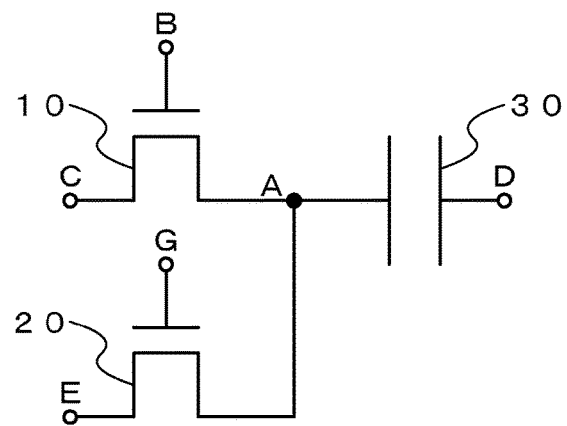
FIGS. 8A and 8B illustrate an example of a semiconductor device including a circuit element having at least one capacitor and two transistors.

In FIG. 8A, structures except the structure in which the node A is electrically connected to the other of the source and the drain of the transistor 20 (the node F in FIG. 1A) are similar to those in FIG. 1A.

The gate of the transistor 20 is electrically connected to a node G in FIG. 8A.

Figure 8B:
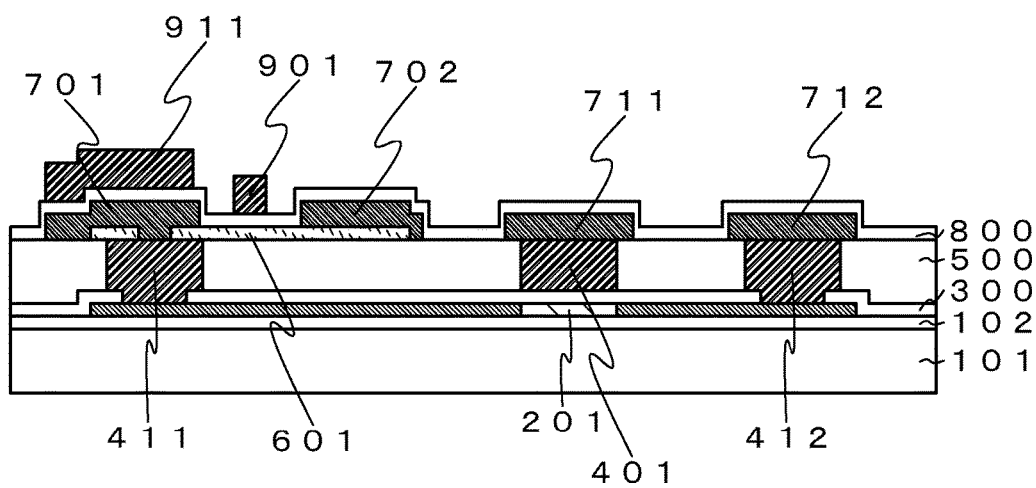

FIG. 8B is an example of a cross-sectional view of a semiconductor device illustrated in FIG. 8A.

FIG. 8B differs from FIG. 1B in that the conductive layer 701 is electrically connected to the conductive layer 411 and the conductive layer 711 is electrically connected to the conductive layer 401.

Figure 9A:
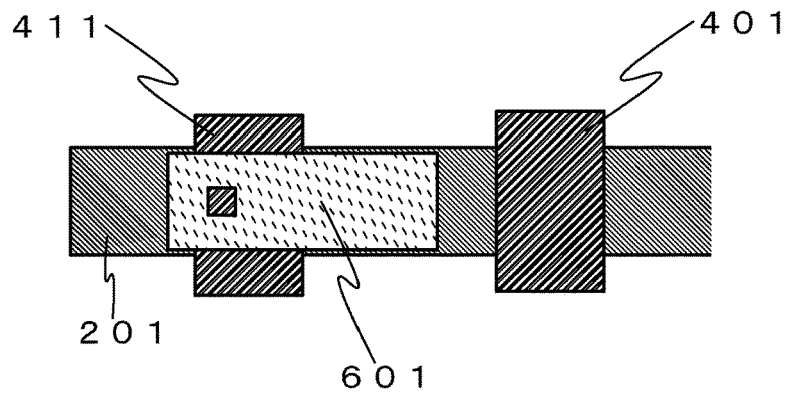
FIGS. 9A to 9C each illustrate an example of a positional relation of the semiconductor layer 201, the conductive layer 401, a conductive layer 411, and the semiconductor layer 601.
Figure 9B:
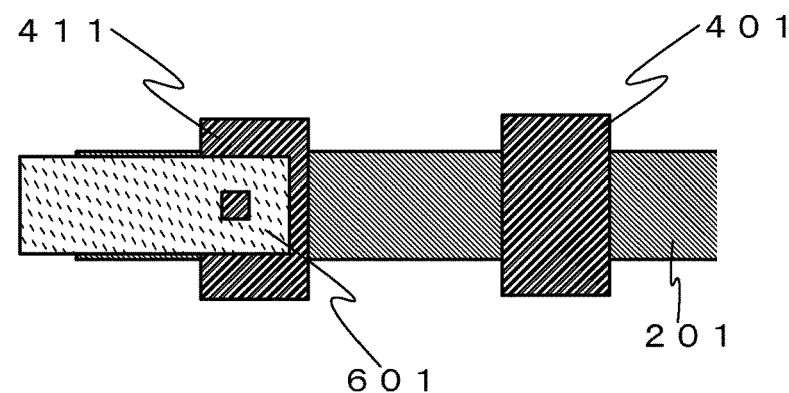
Figure 9C:
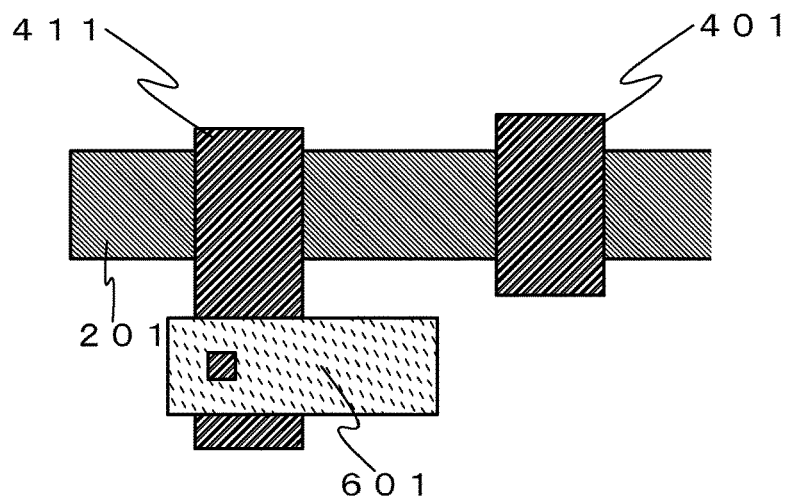

FIGS. 9A to 9C each illustrate an example of a positional relation of the semiconductor layer 201, the conductive layer 401, a conductive layer 411, and the semiconductor layer 601.

In FIGS. 9A to 9C, at least part of the semiconductor layer 201 is provided so as to overlap with at least part of the conductive layer 411 and at least part of the semiconductor layer 601 is provided so as to overlap with at least part of the conductive layer 411.

When the conductive layer 411 is provided so as to overlap with the semiconductor layer 601 and the semiconductor layer 201, an area of a cell in which three elements are provided can be reduced.

In FIGS. 9A to 9C, an opening portion is provided in one end portion of the semiconductor layer 601 but not provided in the other end portion of the semiconductor layer 601.

In FIG. 9A, the whole semiconductor layer 601 is laid over the semiconductor layer 201 and the other end portion of the semiconductor layer 601 is provided between the conductive layer 411 and the conductive layer 401.

In FIG. 9B, part of the semiconductor layer 601 is provided so as to overlap with the semiconductor layer 201 and the other end portion of the semiconductor layer 601 is not provided between the conductive layer 411 and the conductive layer 401.

In FIG. 9C, the semiconductor layer 601 does not overlap with the semiconductor layer 201.

When FIG. 9C is compared to FIG. 9A and FIG. 9B, the case of FIG. 9A and the case of FIG. 9B are preferable because an area of a cell in which three elements are provided can be further reduced.

When FIG. 9A is compared to FIG. 9B, the case of FIG. 9A is preferable because an area of a cell in which three elements are provided can be still further reduced.

The contents of this embodiment or part thereof can be implemented in combination with any of the other embodiments and an example.

Embodiment 7

Figure 10A:
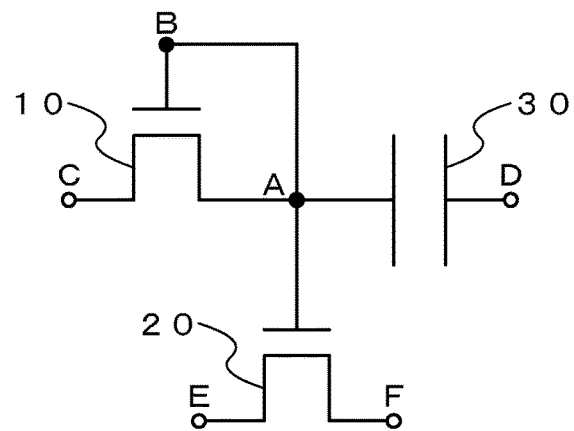
FIGS. 10A and 10B illustrate an example of a semiconductor device including a circuit element having at least one capacitor and two transistors.
Figure 10B:
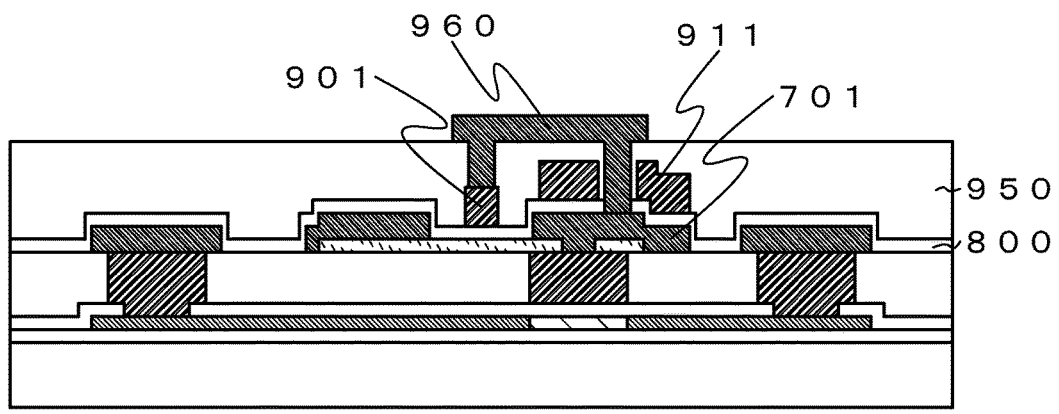

FIGS. 10A and 10B illustrate the case where the node A is electrically connected to the node B in the case of FIGS. 1A and 1B.

Figure 11A:
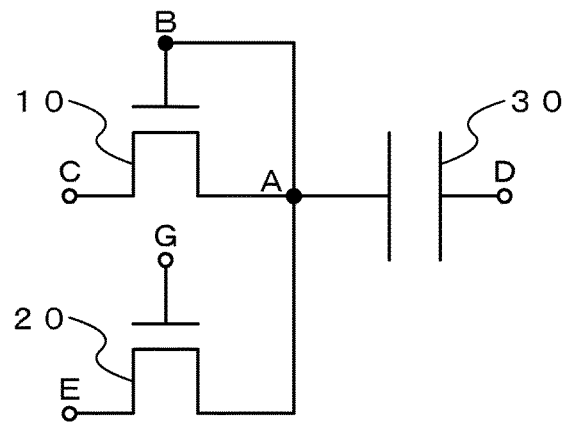
FIGS. 11A and 11B illustrate an example of a semiconductor device including a circuit element having at least one capacitor and two transistors.
Figure 11B:
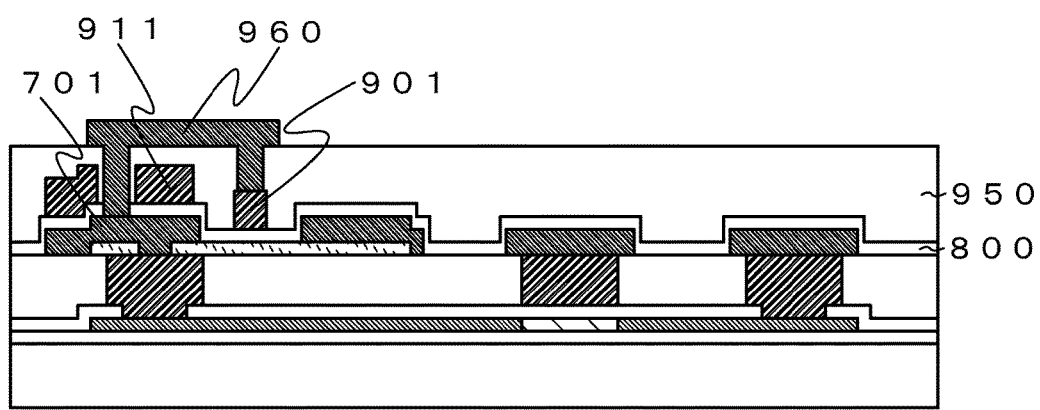

FIGS. 11A and 11B illustrate the case where the node A is electrically connected to the node B in the case of FIGS. 8A and 8B.

That is, the gate of the transistor 10 is electrically connected to the one electrode of the capacitor 30 in FIGS. 10A and 10B and FIGS. 11A and 11B.

Here, FIG. 10B is an example of a cross-sectional view of a semiconductor device illustrated in FIG. 10A.

FIG. 11B is an example of a cross-sectional view of a semiconductor device illustrated in FIG. 11A.

FIG. 10B differs from FIG. 1B in that an insulating layer 950 is provided over the conductive layer 901 and the conductive layer 911 and the conductive layer 960 is provided over the insulating layer 950.

The gate of the transistor 10 (the conductive layer 901) is electrically connected to the one electrode of the capacitor 30 (the conductive layer 701 (common electrode)) with the use of the conductive layer 960.

The conductive layer 960 is electrically connected to the conductive layer 901 through a contact hole provided in the insulating layer 950.

Further, the conductive layer 960 is electrically connected to the conductive layer 701 through an opening portion provided in the conductive layer 911 and a contact hole provided in the insulating layer 950 and the insulating layer 800.

On the other hand, FIG. 11B differs from FIG. 8B in that the insulating layer 950 is provided over the conductive layer 901 and the conductive layer 911 and the conductive layer 960 is provided over the insulating layer 950.

The gate of the transistor 10 (the conductive layer 901) is electrically connected to the one electrode of the capacitor 30 (the conductive layer 701 (common electrode)) with the use of the conductive layer 960.

The conductive layer 960 is electrically connected to the conductive layer 901 through a contact hole provided in the insulating layer 950.

Further, the conductive layer 960 is electrically connected to the conductive layer 701 through an opening portion provided in the conductive layer 911 and a contact hole provided in the insulating layer 950 and the insulating layer 800.

The conductive layer 960 is an electrode or a wiring.

As described above, through the opening portion provided in the conductive layer 911, the conductive layer 960 can be electrically connected to the conductive layer 701 without increasing the area of the conductive layer 701 (common electrode).

The case where an opening portion is provided in the conductive layer 911 so that the gate electrode is electrically connected to the common electrode is described in this embodiment.

Even when the gate electrode is not electrically connected to the common electrode, an opening portion is preferably provided in the conductive layer 911 in the case where the common electrode is electrically connected to another wiring.

Note that when an opening portion is not provided in the conductive layer 911 and the area of the conductive layer 701 is larger than the area of the conductive layer 911, the conductive layer 960 can be electrically connected to the conductive layer 701 only through a contact hole provided in the insulating layer 950 and the insulating layer 800.

Meanwhile, since the area of the conductive layer 701 needs to be larger than the area of the conductive layer 911 when an opening portion is not provided in the conductive layer 911, a structure in which an opening portion is provided in the conductive layer 911 is preferable in view of reducing an area.

In the case where the conductive layer 960 is in contact with the conductive layer 911, the node A is electrically connected to the node D, which results in malfunction of the capacitor 30. Thus, a connection between the conductive layer 960 and the conductive layer 911 needs to be prevented.

As a result, the opening portion provided in the conductive layer 911 is preferably slightly larger than the contact hole provided in the insulating layer 950 and the insulating layer 800.

The contents of this embodiment or part thereof can be implemented in combination with any of the other embodiments and an example.

Embodiment 8

An example of an EL display device (light-emitting device) which is a kind of semiconductor device will be described with reference to FIGS. 12A and 12B.

Figure 12A:
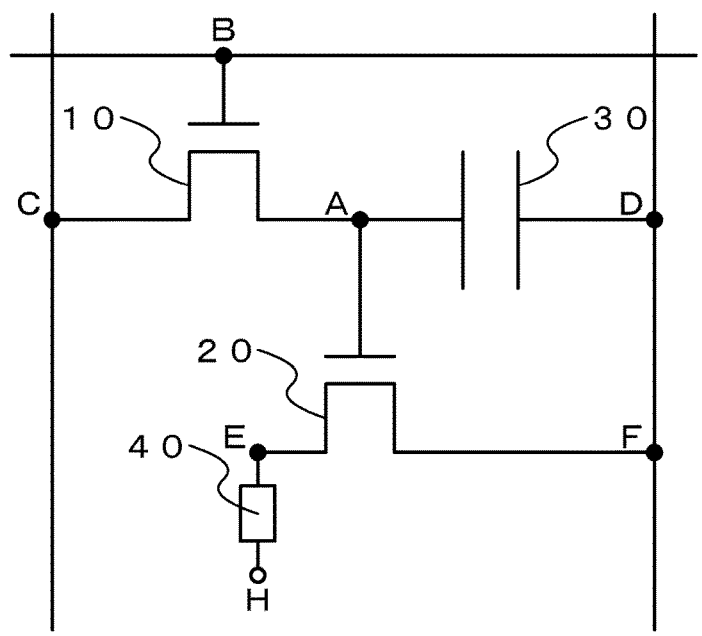
FIGS. 12A and 12B illustrate an example of an EL display device.

FIG. 12A differs from FIG. 1A in that wirings are electrically connected to the nodes B to F and the node E is electrically connected to one electrode of a display element 40.

Figure 12B:
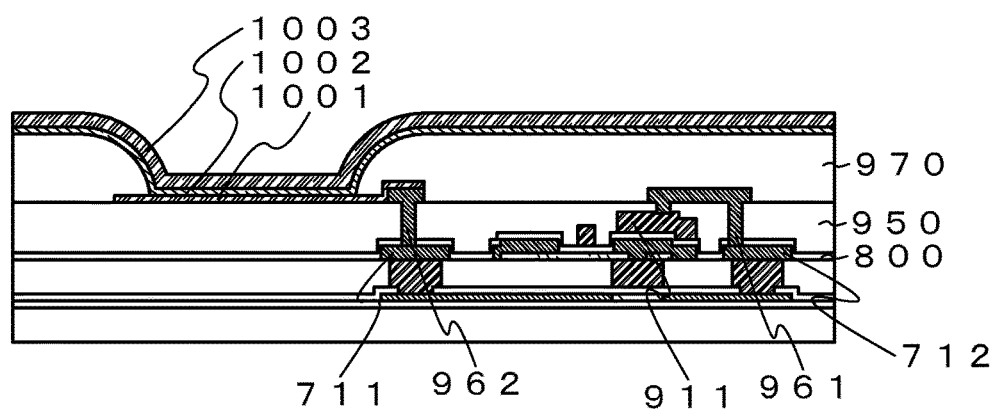

Although a light-emitting element (EL element) is used as the display element 40 in FIGS. 12A and 12B, another display element (e.g., a liquid crystal display element or an electrophoretic element) may be used.

The node B is electrically connected to a wiring (scan line) for controlling on and off of the transistor 10.

The node C is electrically connected to a wiring (signal line) for inputting a signal.

The node D and the node E are electrically connected to a wiring (power supply line) to which a voltage is applied.

A node H is electrically connected to the other electrode of the display element 40.

An operation of the EL display device in FIGS. 12A and 12B will be described.

First, a signal (voltage) for turning on the transistor 10 is supplied to the node B.

Next, a signal is supplied from the node C and electric charge is accumulated in the capacitor 30.

The accumulation of electric charge in the capacitor 30 causes current to flow to the transistor 20.

Flow of the current to the transistor 20 causes the display element 40, which is a light-emitting element, to emit light.

When the amount of the electric charge accumulated in the capacitor 30 is controlled, the amount of the current which flows to the transistor 20 can be controlled.

When the amount of the current which flows to the transistor 20 can be controlled, the luminance of the light-emitting element can be controlled.

In order to prevent the light-emitting element from emitting light, electric charge is not accumulated in the capacitor.

FIG. 12B is an example of a cross-sectional view of the semiconductor device illustrated in FIG. 12A.

FIG. 12B differs from FIG. 1B in that the insulating layer 950, a conductive layer 961, a conductive layer 962, an insulating layer 970, a conductive layer 1001, an EL layer 1002, and a conductive layer 1003 are added.

The insulating layer 950 is provided over the conductive layer 911.

The conductive layer 961 and the conductive layer 962 are provided over the insulating layer 950.

The conductive layer 961 is electrically connected to the conductive layer 911 through a contact hole provided in the insulating layer 950.

Further, the conductive layer 961 is electrically connected to the conductive layer 712 through a contact hole provided in the insulating layer 950 and the insulating layer 800.

The conductive layer 961 is a wiring electrically connected to the node D and the node E and corresponds to a power supply line to which a predetermined voltage is applied.

The conductive layer 962 is electrically connected to the conductive layer 711 through a contact hole provided in the insulating layer 950 and the insulating layer 800.

The conductive layer 962 is a wiring for electrically connecting the one electrode of the display element 40 and one of the source and the drain of the transistor 20.

The conductive layer 1001 is provided over the conductive layer 962 and the insulating layer 950.

The insulating layer 970 is provided so as to cover end portions of the conductive layer 1001, the conductive layer 961, and the conductive layer 962.

The EL layer 1002 is provided over the conductive layer 1001 and the insulating layer 970.

The conductive layer 1003 is provided over the EL layer 1002.

The conductive layer 1001 is the one electrode of the display element 40.

The conductive layer 1003 is the other electrode of the display element 40.

With the structure illustrated in FIGS. 12A and 12B, an area occupied by three elements in a pixel can be reduced; thus, the aperture ratio of the EL display device can be increased.

The contents of this embodiment or part thereof can be implemented in combination with any of the other embodiments and an example.

Embodiment 9

An example of a storage device which is a kind of semiconductor device will be described with reference to FIGS. 13A and 13B.

Figure 13A:
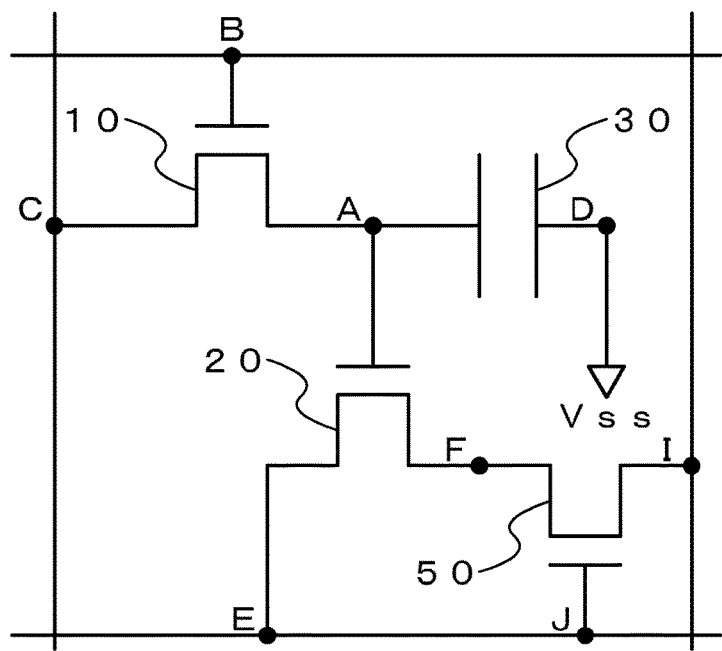
FIGS. 13A and 13B illustrate an example of a semiconductor device including a memory circuit.

FIG. 13A differs from FIG. 1A in that the node B, the node C, and the node E are electrically connected to wirings and the node F is electrically connected to a transistor 50.

The node B is electrically connected to a wiring (writing word line) for controlling on and off of the transistor 10 at the time of writing.

The node C is electrically connected to a wiring (writing bit line) for inputting a signal at the time of writing.

The node D is electrically connected to a power supply that supplies a low supply voltage Vss.

The node E and a node J are electrically connected to a wiring (reading word line) to which a voltage is applied at the time of reading.

A node I is electrically connected to a wiring (reading bit line) for extracting a signal at the time of reading.

An operation of the storage device in FIGS. 13A and 13B will be described.

First, a signal (voltage) for turning on the transistor 10 is supplied to the node B at the time of writing.

Next, a signal 0 or 1 is input from the node C and the signal 0 or 1 is stored in the capacitor.

At the time of reading, a voltage is applied to the reading word line, so that an output from the reading bit line is read.

Note that at the time of reading, the transistor 20 is turned off when 0 is stored, whereby the output from the reading bit line is also 0.

On the other hand, at the time of reading, the transistor 20 is turned off when 1 is stored, whereby the output from the reading bit line is also 1.

Note that the transistor 50 is provided so as to prevent leakage; however, the transistor 50 is not necessarily provided and the node F may be electrically connected to the reading bit line.

Figure 13B:
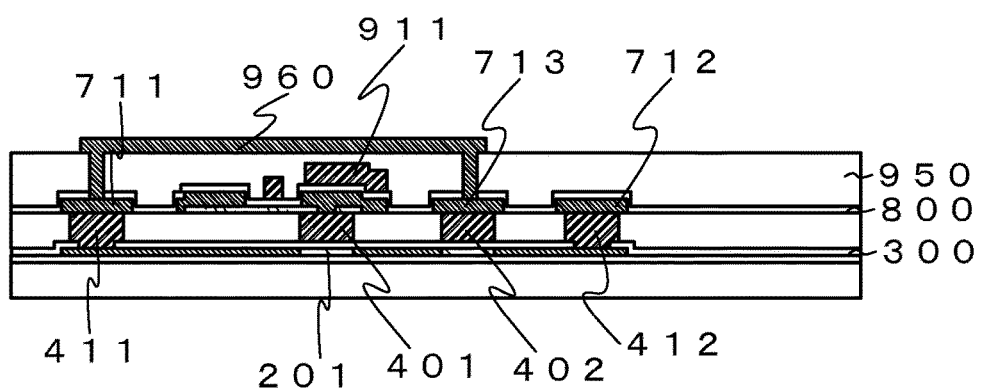

FIG. 13B is an example of a cross-sectional view of the semiconductor device illustrated in FIG. 13A.

FIG. 13B differs from FIG. 1B in that a conductive layer 402, a conductive layer 713, the insulating layer 950, and the conductive layer 960 are added.

The conductive layer 402 is provided over the insulating layer 300.

In view of reducing the number of steps, the conductive layer 402 is preferably formed through the same step as the conductive layer 401.

The conductive layer 402 is provided between the conductive layer 401 and the conductive layer 412.

The conductive layer 402 corresponds to a gate electrode of the transistor 50.

The conductive layer 713 is provided over the conductive layer 402.

In view of reducing the number of steps, the conductive layer 713 is preferably formed through the same step as the conductive layer 711 and the conductive layer 712.

The conductive layer 713 is electrically connected to the conductive layer 402.

The insulating layer 950 is provided over the conductive layer 911.

The conductive layer 960 is provided over the insulating layer 950.

The conductive layer 711 is electrically connected to the conductive layer 713 through the conductive layer 960.

The conductive layer 960 is electrically connected to the conductive layer 711 through a contact hole provided in the insulating layer 950 and the insulating layer 800.

The conductive layer 960 is electrically connected to the conductive layer 713 through a contact hole provided in the insulating layer 950 and the insulating layer 800.

With the structure illustrated in FIGS. 13A and 13B, an area of a memory cell can be reduced.

Note that the semiconductor layer 201, the insulating layer 300, and the conductive layer 401 in FIG. 13B respectively correspond to the semiconductor layer, the gate insulating layer, and the gate electrode of the transistor 20 in FIG. 13A.

Further, the semiconductor layer 201, the insulating layer 300, and the conductive layer 402 in FIG. 13B respectively correspond to a semiconductor layer, a gate insulating layer, and the gate electrode of the transistor 50 in FIG. 13A.

That is, in FIGS. 13A and 13B, the semiconductor layer of the transistor 20 and the semiconductor layer of the transistor 50 share a layer (are formed of a common layer).

When the semiconductor layer of the transistor 20 and the semiconductor layer of the transistor 50 share a layer (are formed of a common layer), the transistor 50 can be added without an extreme increase in area of the memory cell.

The contents of this embodiment or part thereof can be implemented in combination with any of the other embodiments and an example.

Embodiment 10

Figure 14A:
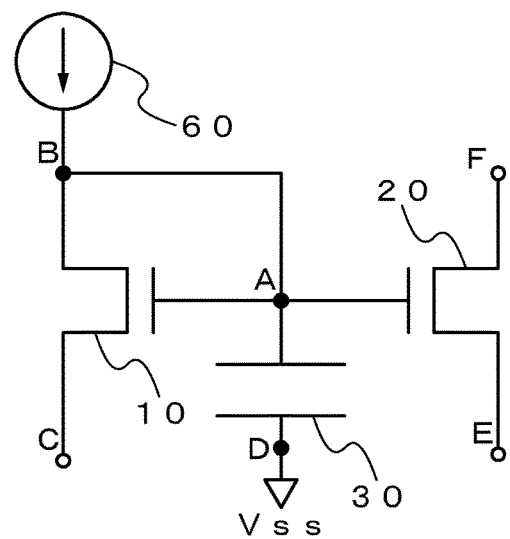
FIGS. 14A and 14B illustrate an example of a semiconductor device including a current mirror circuit.

FIG. 14A is an example of a semiconductor device including a current mirror circuit. FIG. 14A differs from FIG. 10A in that the node B is electrically connected to a constant current source 60 and the node D is electrically connected to a power supply that supplies the low supply voltage Vss.

Figure 14B:
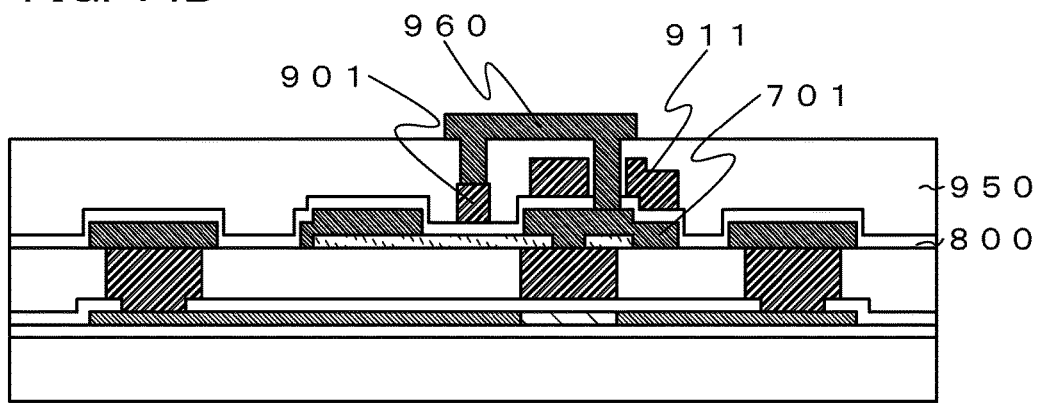

FIG. 14B is an example of a cross-sectional view of the semiconductor device illustrated in FIG. 14A and has a structure similar to that in FIG. 10B.

Note that in the current mirror circuit in FIGS. 14A and 14B, current which is constant times current flowing to the transistor 10 flows to the transistor 20.

The contents of this embodiment or part thereof can be implemented in combination with any of the other embodiments and an example.

Embodiment 11

Figure 15A:
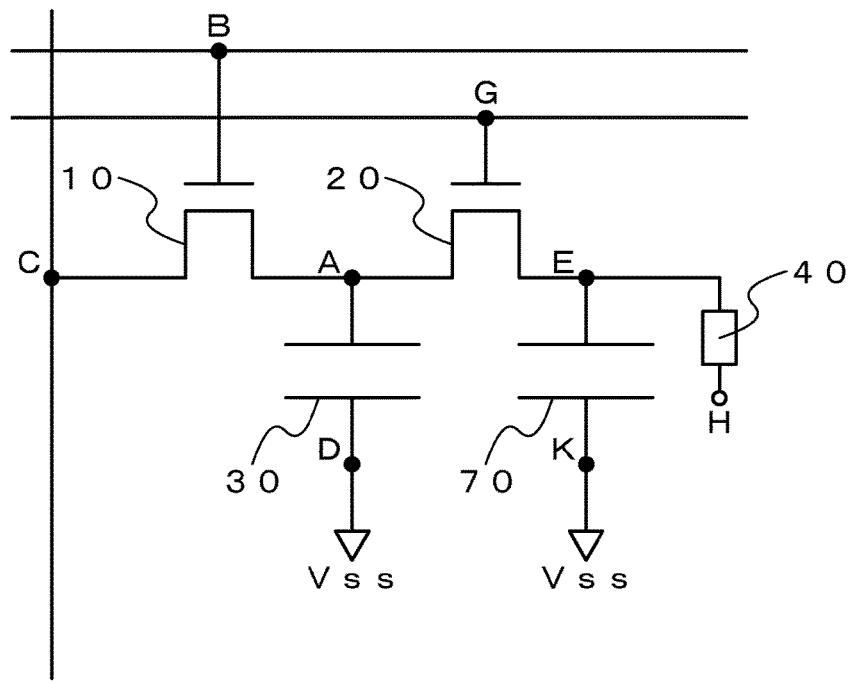
FIGS. 15A and 15B illustrate an example of a liquid crystal display device.

FIG. 15A is an example of a liquid crystal display device which is a kind of semiconductor device. FIG. 15A differs from FIG. 8A in that the node E is electrically connected to one electrode of a capacitor 70 and the one electrode of the display element 40.

Figure 15B:
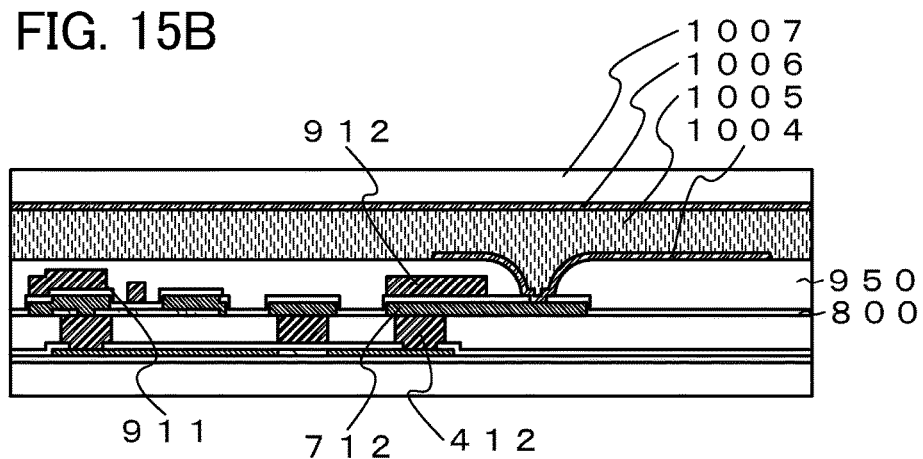

Although a liquid crystal display element is used as the display element in FIGS. 15A and 15B, another display element (e.g., a light-emitting element or an electrophoretic element) may also be used.

The node B is electrically connected to a wiring (scan line) for controlling on and off of the transistor 10.

The node C is electrically connected to a wiring (signal line) for inputting a signal.

The node D is electrically connected to a power supply that supplies the low supply voltage Vss.

The node G is electrically connected to a wiring (transfer line) for transferring electric charge accumulated in the capacitor 30 to the capacitor 70.

A node K is electrically connected to a power supply that supplies the low supply voltage Vss.

Here, an operation of the liquid crystal display device in FIGS. 15A and 15B will be described.

First, a signal (voltage) for turning on the transistor 10 is supplied to the node B in a writing period.

Next, a signal is supplied from the node C and electric charge is accumulated in the capacitor 30 in a reading period.

Then, in a transfer period, a signal (voltage) for turning off the transistor 10 is supplied to the node B, a signal (voltage) for turning on the transistor 20 is supplied to the node G, and the electric charge accumulated in the capacitor 30 is transferred to the capacitor 70.

In a display period, a signal (voltage) for turning off the transistor 20 is supplied to the node G and the display element 40 is driven.

The operation in the writing period is performed again along with the operation in the display period.

With the structure in FIGS. 15A and 15B, the operation in the writing period can be performed along with the operation in the display period as described above.

FIG. 15B is an example of a cross-sectional view of the semiconductor device illustrated in FIG. 15A.

FIG. 15B differs from FIG. 8B in that a conductive layer 912, the insulating layer 950, a conductive layer 1004, a liquid crystal layer 1005, a conductive layer 1006, and a substrate 1007 are added.

The conductive layer 912 is provided over the insulating layer 800.

The conductive layer 912 corresponds to the other electrode of the capacitor 70.

The insulating layer 950 is provided over the conductive layer 912.

The conductive layer 1004 is provided over the insulating layer 950.

The conductive layer 1004 is electrically connected to the conductive layer 712 through a contact hole provided in the insulating layer 950 and the insulating layer 800.

The substrate 1007 provided with the conductive layer 1006 is provided to face the conductive layer 1004 with the conductive layer 1006 is provided therebetween.

The liquid crystal layer 1005 fills a space between the conductive layer 1004 and the conductive layer 1006.

An alignment film is preferably provided on a surface of the conductive layer 1004 and a surface of the conductive layer 1006.

Note that the conductive layer 712, the insulating layer 800, and the conductive layer 912 in FIG. 15B respectively correspond to the one electrode of the capacitor 70, a dielectric layer of the capacitor 70, and the other electrode of the capacitor 70 in FIG. 15A.

Further, the conductive layer 1004, the liquid crystal layer 1005, and the conductive layer 1006 in FIG. 15B respectively correspond to the one electrode of the display element 40, a liquid crystal layer of the display element 40, and the other electrode of the display element 40 in FIG. 15A.

With the structure illustrated in FIGS. 15A and 15B, the aperture ratio of the liquid crystal display device can be increased.

In addition, since the capacitor 70 can be formed in such a manner that the conductive layer 912 is formed so as to simply overlap with the conductive layer 712, the capacitor 70 can be added without decreasing the aperture of the liquid crystal display device.

The contents of this embodiment or part thereof can be implemented in combination with any of the other embodiments and an example.

Embodiment 12

An example of a semiconductor device including a charge pump circuit (a kind of boosting circuit) will be described with reference to FIGS. 16A and 16B.

Figure 16A:
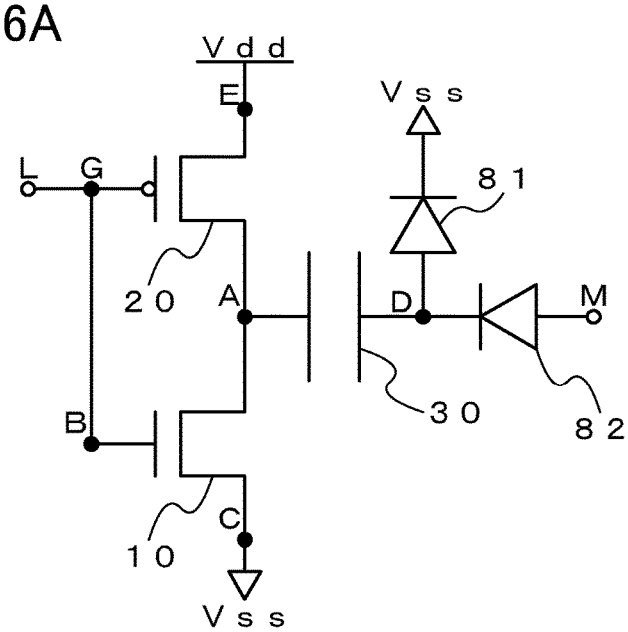
FIGS. 16A and 16B illustrate an example of a semiconductor device including a charge pump circuit (one kind of boosting circuit)

FIG. 16A differs from FIG. 8A in that the node D is electrically connected to a diode 81 and a diode 82.

FIG. 16A further differs from FIG. 8A in that the node B and the node G are electrically connected to a node L, the node E is electrically connected to a power supply that supplies a supply voltage Vdd, and the node C is electrically connected to a power supply that supplies the low supply voltage Vss.

In other words, the transistor 10 and the transistor 20 are used as an inverter.

Either an N-channel transistor or a P-channel transistor may be used in other embodiments. In this embodiment, the transistor 20 is a P-channel transistor and the transistor 10 is an N-channel transistor to form an inverter.

An output of the diode 81 is electrically connected to a power supply that supplies the low supply voltage Vss.

An input of the diode 81 is electrically connected to an output of the diode 82 and the other electrode of the capacitor 30.

An input of the diode 82 is electrically connected to a node M.

Note that since the semiconductor device illustrated in FIG. 16A includes a negative boosting circuit, a negative voltage which is boosted is output from the node M, which is an output terminal.

Figure 16B:
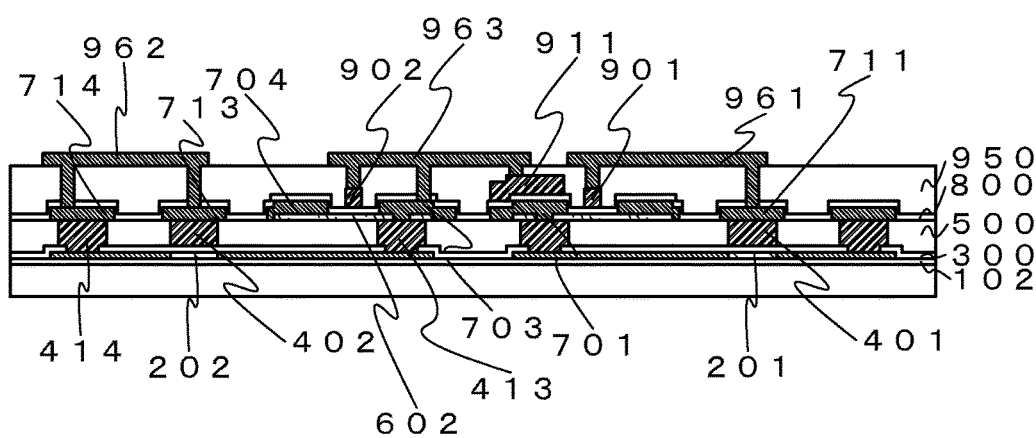

FIG. 16B is an example of a cross-sectional view of the semiconductor device illustrated in FIG. 16A.

FIG. 16B differs from FIG. 8B in that a semiconductor layer 202, the conductive layer 402, a conductive layer 413, a conductive layer 414, a semiconductor layer 602, a conductive layer 703, a conductive layer 704, the conductive layer 713, a conductive layer 714, a conductive layer 902, the insulating layer 950, the conductive layer 961, the conductive layer 962, and a conductive layer 963 are added.

In FIG. 16B, diode-connected transistors are used as the diode 81 and the diode 82.

The semiconductor layer 202 is provided over the insulating layer 102.

In view of reducing the number of steps, the semiconductor layer 202 is preferably formed through the same step as the semiconductor layer 201.

The semiconductor layer 202 corresponds to a semiconductor layer of the diode 82 (diode-connected transistor).

The conductive layer 402 is provided over the insulating layer 300.

The conductive layer 402 corresponds to a gate electrode of the diode 82 (diode-connected transistor).

The conductive layer 413 is electrically connected to the semiconductor layer 202 through an opening portion provided in the insulating layer 300.

The conductive layer 414 is electrically connected to the semiconductor layer 202 through an opening portion provided in the insulating layer 300.

The conductive layer 413 and the conductive layer 414 are connection electrodes.

In view of reducing the number of steps, the conductive layer 402, the conductive layer 413, and the conductive layer 414 are preferably formed through the same step as the conductive layer 401.

The semiconductor layer 602 is provided over the insulating layer 500.

An opening portion is provided in the semiconductor layer 602.

The conductive layer 703 and the conductive layer 704 are provided over the semiconductor layer 602.

The conductive layer 703 corresponds to one of a source electrode and a drain electrode of the diode 81 (diode-connected transistor).

The conductive layer 704 corresponds to the other of the source electrode and the drain electrode of the diode 81 (diode-connected transistor).

The conductive layer 703 is electrically connected to the conductive layer 413 through an opening portion provided in the semiconductor layer 602.

The conductive layer 713 is electrically connected to the conductive layer 402.

The conductive layer 714 is electrically connected to the conductive layer 414.

In view of reducing the number of steps, the conductive layer 703, the conductive layer 704, the conductive layer 713, and the conductive layer 714 are preferably formed through the same step as the conductive layer 711.

The insulating layer 950 is provided over the conductive layer 911.

The conductive layer 961, the conductive layer 962, and the conductive layer 963 are provided over the insulating layer 950.

The conductive layer 961 electrically connects the conductive layer 711 and the conductive layer 901.

Specifically, the conductive layer 961 is electrically connected to the conductive layer 711 through a contact hole provided in the insulating layer 950 and the insulating layer 800.

Further, the conductive layer 961 is electrically connected to the conductive layer 901 through a contact hole provided in the insulating layer 950.

The conductive layer 962 electrically connects the conductive layer 713 and the conductive layer 714.

Specifically, the conductive layer 962 is electrically connected to the conductive layer 713 through a contact hole provided in the insulating layer 950 and the insulating layer 800.

Further, the conductive layer 962 is electrically connected to the conductive layer 714 through a contact hole provided in the insulating layer 950 and the insulating layer 800.

The conductive layer 963 electrically connects the conductive layer 703, the conductive layer 902, and the conductive layer 911.

Specifically, the conductive layer 963 is electrically connected to the conductive layer 703 through a contact hole provided in the insulating layer 950 and the insulating layer 800.

Further, the conductive layer 963 is electrically connected to the conductive layer 902 through a contact hole provided in the insulating layer 950.

Furthermore, the conductive layer 963 is electrically connected to the conductive layer 911 through a contact hole provided in the insulating layer 950.

In view of reducing the number of steps, the conductive layer 961, the conductive layer 962, and the conductive layer 963 are preferably formed through the same step.

Note that the semiconductor layer 202, the insulating layer 300, and the conductive layer 402 in FIG. 16B respectively correspond to the semiconductor layer of the diode 82 (diode-connected transistor), a gate insulating layer of the diode 82, and the gate electrode of the diode 82 in FIG. 16A.

Further, the semiconductor layer 602, the insulating layer 800, and the conductive layer 902 in FIG. 16B respectively correspond to a semiconductor layer of the diode 81 (diode-connected transistor), a gate insulating layer of the diode 81, and a gate electrode of the diode 81 in FIG. 16A.

Since the diode 81 and the diode 82 are stacked in FIG. 16B, an area of a circuit can be reduced even in the case where the diode 81 and the diode 82 are provided.

The contents of this embodiment or part thereof can be implemented in combination with any of the other embodiments and an example.

Embodiment 13

An example of a semiconductor device including a voltage doubler rectifier circuit (a kind of boosting circuit) will be described with reference to FIGS. 17A and 17B.

Figure 17A:
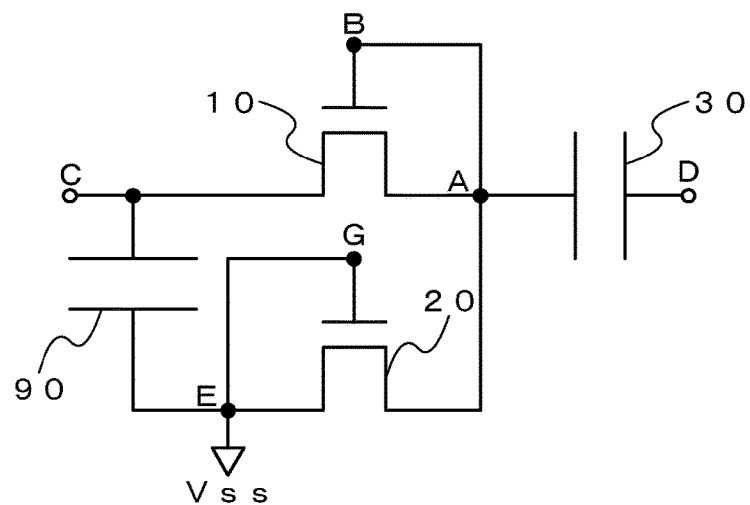
FIGS. 17A and 17B illustrate an example of a semiconductor device including a voltage doubler rectifier circuit (one kind of boosting circuit)

FIG. 17A differs from FIG. 11A in that the node E is electrically connected to the node G and one electrode of a capacitor 90 and the other electrode of the capacitor 90 is electrically connected to the node C.

Figure 17B:
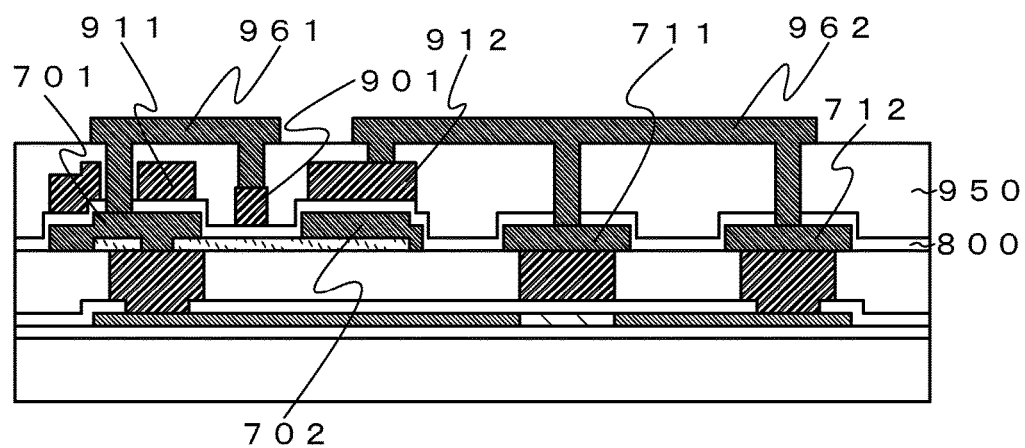

In the voltage doubler rectifier circuit in FIGS. 17A and 17B, a voltage input to the node D can be approximately doubled and then can be output from the node C.

FIG. 17B is an example of a cross-sectional view of the semiconductor device illustrated in FIG. 17A.

FIG. 17B differs from FIG. 11B in that the conductive layer 912 and the conductive layer 962 are added.

The conductive layer 912 is provided over the insulating layer 800.

The conductive layer 962 is provided over the insulating layer 950.

The conductive layer 962 electrically connects the conductive layer 711, the conductive layer 712, and the conductive layer 912.

Specifically, the conductive layer 962 is electrically connected to the conductive layer 711 through a contact hole provided in the insulating layer 950 and the insulating layer 800.

Further, the conductive layer 962 is electrically connected to the conductive layer 712 through a contact hole provided in the insulating layer 950 and the insulating layer 800.

Furthermore, the conductive layer 962 is electrically connected to the conductive layer 912 through a contact hole provided in the insulating layer 950.

The conductive layer 912, the insulating layer 800, and the conductive layer 702 in FIG. 17B respectively correspond to the one electrode, a dielectric layer, and the other electrode of the capacitor 90 in FIG. 17A.

The contents of this embodiment or part thereof can be implemented in combination with any of the other embodiments and an example.

Embodiment 14

Materials of the layers will be described.

A substrate can be, but not limited to, a glass substrate, a quartz substrate, a metal substrate (e.g., a stainless-steel substrate), a semiconductor substrate, or the like.

An insulating layer can be formed using any material having an insulating property. For example, the insulating layer can be, but not limited to, a silicon oxide film, a silicon nitride film, a silicon oxide film containing nitrogen, a silicon nitride film containing oxygen, a polyimide film, an acrylic film, a siloxane polymer film, an aluminum nitride film, an aluminum oxide film, or a hafnium oxide film. The insulating layer may have a single-layer structure or a stacked-layer structure.

A conductive layer can be formed using any material having a conductive property. For example, the conductive layer can be, but not limited to, an aluminum film, a titanium film, a molybdenum film, a tungsten film, a gold film, a silver film, a copper film, a silicon film containing a donor element or an acceptor element, an alloy film, or a transparent conductive film (e.g., an indium tin oxide film). The conductive layer may have a single-layer structure or a stacked-layer structure.

A conductive layer which is in contact with a semiconductor layer containing silicon preferably has a stacked-layer structure including a metal film and a silicon film containing a donor element or an acceptor element.

In that case, the stacked-layer structure is formed so that the silicon film containing a donor element or an acceptor element is in contact with the semiconductor layer.

A semiconductor layer can be formed using any material which is a semiconductor. A semiconductor film containing silicon, an oxide semiconductor film, an organic semiconductor film, or the like can be used, but not limited thereto. The semiconductor layer may have a single-layer structure or a stacked-layer structure.

A source region and a drain region in the semiconductor layer preferably contain a donor element or an acceptor element because the resistance of the source region and the drain region can be reduced.

Note that the semiconductor layer 201 and the semiconductor layer 601 may be the same kind of semiconductor layer or different kinds of semiconductor layer.

Silicon (Si), silicon germanium (SiGe), silicon carbide (SiC), or the like can be used for the semiconductor film containing silicon, but not limited thereto.

An oxide semiconductor preferably contains at least indium (In) or zinc (Zn). In particular, the oxide semiconductor preferably contains In and Zn.

In addition, as a stabilizer for reducing variation in electrical characteristics of a transistor including the oxide semiconductor, it is preferable that one or more elements selected from gallium (Ga), tin (Sn), hafnium (Hf), aluminum (Al), and lanthanoid be contained.

As lanthanoid, there are lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

For a single-component metal oxide semiconductor, for example, an indium oxide, a tin oxide, a zinc oxide, or the like can be used.

For a two-component metal oxide semiconductor, for example, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, or the like can be used.

For a three-component metal oxide semiconductor, for example, an In—Ga—Zn-based oxide (also referred to as IGZO), an In—Sn—Zn-based oxide, a Sn—Ga—Zn-based oxide, an In—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an Al—Ga—Zn-based oxide, a Sn—Al—Zn-based oxide, or the like can be used.

For a four-component metal oxide semiconductor, for example, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, an In—Hf—Al—Zn-based oxide, or the like can be used.

Note that here for example, an In—Ga—Zn-based oxide refers to an oxide containing In, Ga, and Zn, and there is no limitation on the ratio of In:Ga:Zn. The In—Ga—Zn-based oxide may contain a metal element other than In, Ga, and Zn.

For example, it is possible to use an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions.

Alternatively, it is possible to use an In—Sn—Zn-based oxide with an atomic ratio of In:Sn:Zn=1:1:1 (=1/3:1/3:1/3), In:Sn:Zn=2:1:3 (=1/3:1/6 1/2), or In:Sn:Zn=2:1:5 (=1/4:1/8:5/8), or any of oxides whose composition is in the neighborhood of the above compositions.

Without limitation to the materials given above, a material with an appropriate composition may be used depending on needed semiconductor characteristics (e.g., mobility, threshold voltage, and variation). In order to obtain the needed semiconductor characteristics, an oxide semiconductor preferably has appropriate carrier concentration, impurity concentration, defect density, atomic ratio between a metal element and oxygen, interatomic distance, density, and the like.

The oxide semiconductor may be either single crystal or non-single-crystal.

In the case where the oxide semiconductor is non-single-crystal, the oxide semiconductor may be either amorphous or polycrystalline. Further, the oxide semiconductor may have a structure including a crystalline portion in an amorphous portion. Note that a non-amorphous structure is preferred since an amorphous structure has many defects.

The contents of this embodiment or part thereof can be implemented in combination with any of the other embodiments and an example.

Embodiment 15

In FIGS. 12A and 12B (EL display device), FIGS. 13A and 13B (storage device), FIGS. 15A and 15B (liquid crystal display device), and the like, the transistor 10 has a function of controlling whether or not electric charge is accumulated in the capacitor 30 and a function of preventing the electric charge accumulated in the capacitor 30 from leaking to nodes other than the node A.

Thus, the semiconductor layer of the transistor 10 in FIGS. 12A and 12B (EL display device), FIGS. 13A and 13B (storage device), and FIGS. 15A and 15B (liquid crystal display device) is preferably formed using an oxide semiconductor layer.

This is because a transistor formed using an oxide semiconductor has significantly low leakage current between a source and a drain (off-state current of a transistor), compared to a transistor formed using a semiconductor containing silicon, owing to a wider band gap of an oxide semiconductor than silicon.

In contrast, the transistor 20 in FIGS. 12A and 12B and FIGS. 13A and 13B preferably includes a semiconductor having high mobility so that electric charge can be transferred between the node E and the node F quickly.

Further, the transistor 20 in FIGS. 15A and 15B preferably includes a semiconductor having high mobility so that electric charge can be transferred between the node A and the node E.

In particular, a crystalline semiconductor containing silicon is preferably used as the semiconductor having high mobility.

As the crystalline semiconductor, a single crystal semiconductor is the most preferable.

The contents of this embodiment or part thereof can be implemented in combination with any of the other embodiments and an example.

Embodiment 16

The conductive layer 701 provided on and in contact with the semiconductor layer 601 is used as a common electrode in other embodiments.

Figure 18:
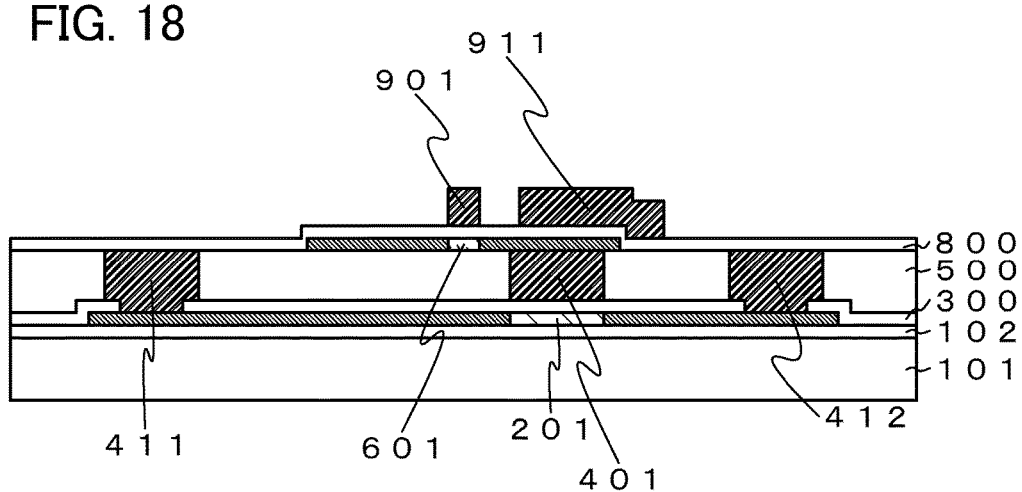
FIG. 18 illustrates an example of a semiconductor device including a circuit element having at least one capacitor and two transistors.

However, one of a source region and a drain region in the semiconductor layer 601 may be used as a common electrode without the conductive layer 701 as illustrated in FIG. 18.

Note that in the case where the other of the source region and the drain region in the semiconductor layer 601 is provided with a capacitor as illustrated in FIGS. 17A and 17B, for example, the other of the source region and the drain region in the semiconductor layer 601 can be the one electrode of the capacitor 90.

In the case of FIG. 18, the one of the source region and the drain region in the semiconductor layer 601, the insulating layer 800, and the conductive layer 911, respectively correspond to the one electrode of the capacitor 30, the dielectric layer of the capacitor 30, and the other electrode of the capacitor 30.

Note that a donor element or an acceptor element is preferably added to the source region and the drain region in the semiconductor layer 601 so as to reduce the resistance of the source region and the drain region in the semiconductor layer 601.

The structure in FIG. 18 is superior to the structures in FIG. 1B and the like in that a step of forming the conductive layer 701 can be omitted.

In contrast, the structures in which the conductive layer 701 is provided, which are illustrated in FIG. 1B and the like, are superior to the structure in FIG. 18 in that the resistance of one of a source and a drain of a transistor is small.

Accordingly, the structure in FIG. 18 is preferably employed when a reduction in the number of steps has a high priority, and the structures in which the conductive layer 701 is provided, which are illustrated in FIG. 1B and the like, are preferably employed when an improvement of circuit characteristics has a high priority.

The contents of this embodiment or part thereof can be implemented in combination with any of the other embodiments and an example.

Embodiment 17

Figure 19A:
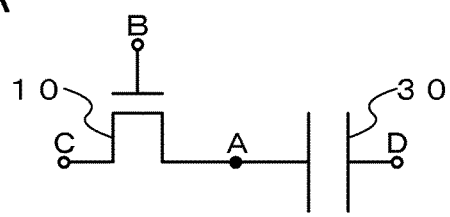
FIGS. 19A and 19B illustrate an example of a semiconductor device including a circuit element having at least one capacitor and one transistor.

FIG. 19A is an example of a semiconductor device which includes a circuit element having the transistor 10 and the capacitor 30.

In FIG. 19A, the node A is electrically connected to the one of the source and the drain of the transistor 10 and the one electrode of the capacitor 30.

Figure 19B:
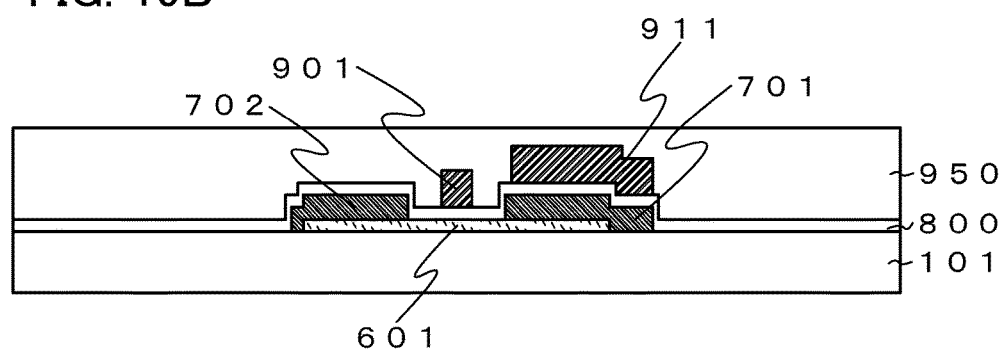

FIG. 19B is an example of a cross-sectional view of the semiconductor device illustrated in FIG. 19A.

The semiconductor device in FIG. 19B includes the substrate 101, the semiconductor layer 601, the conductive layer 701, the conductive layer 702, the insulating layer 800, the conductive layer 901, the conductive layer 911, and the insulating layer 950.

The semiconductor layer 601 is provided over the substrate 101.

The conductive layer 701 and the conductive layer 702 are provided over the semiconductor layer 601.

The conductive layer 701 is a common electrode which serves as the one of the source electrode (source wiring) and the drain electrode (drain wiring) of the transistor 10 in FIG. 19A and the one electrode of the capacitor 30 in FIG. 19A.

When the conductive layer 701 (common electrode) is provided on and in contact with the semiconductor layer 601 as illustrated in FIG. 19B, low contact resistance between the conductive layer 701 (common electrode) and the semiconductor layer 601 can be obtained.

With the low contact resistance between the conductive layer 701 (common electrode) and the semiconductor layer 601, low resistance between the node A and the capacitor 30 in FIG. 19A is obtained; thus, charge accumulation in the capacitor 30 can be performed quickly.

When the charge accumulation in the capacitor 30 can be performed quickly, the operation speed of a circuit can be improved.

The conductive layer 702 corresponds to the other of the source electrode (source wiring) and the drain electrode (drain wiring) of the transistor 10 in FIG. 19A.

The insulating layer 800 is provided over the conductive layer 701 and the conductive layer 702.

The insulating layer 800 corresponds to the gate insulating layer of the transistor 10 in FIG. 19A. The insulating layer 800 also corresponds to the dielectric layer of the capacitor 30 in FIG. 19A.

The conductive layer 901 and the conductive layer 911 are provided over the insulating layer 800.

The conductive layer 901 corresponds to the gate electrode of the transistor 10 in FIG. 19A.

The conductive layer 911 corresponds to the other electrode of the capacitor 30 in FIG. 19A.

Since the conductive layer 901 is the gate electrode (gate wiring), at least part of the conductive layer 901 overlaps with a channel formation region of the semiconductor layer 601.

As described above, when a common electrode, which serves as one of a source and a drain of a transistor and one electrode of a capacitor, is provided, in a semiconductor device, an area occupied by a cell including two elements (one capacitor and one transistor) can be reduced.

The case where the transistor is provided on and in contact with the substrate having an insulating surface is described in this embodiment; however, an insulating layer may be provided between the substrate and the transistor.

Further, an insulating layer may be provided between the substrate and the transistor and another transistor may be provided over the substrate and under the insulating layer.

That is, this embodiment can be applied to any semiconductor device that has a transistor provided over an insulating surface.

Further, this embodiment can also be applied to any semiconductor device that has a transistor whose semiconductor layer is formed using a semiconductor substrate (e.g., a silicon wafer).

Furthermore, this embodiment can also be applied to a case of a bottom-gate transistor.

In other words, a structure in which a gate insulating layer is provided under the semiconductor layer 601 and a gate electrode is provided under the semiconductor layer 601 with the gate insulating layer provided therebetween may be employed in FIG. 19B.

The contents of this embodiment or part thereof can be implemented in combination with any of the other embodiments and an example.

Embodiment 18

FIGS. 20A and 20B and FIGS. 21A and 21B illustrate the case where the node A is electrically connected to the node B in the case of FIGS. 19A and 19B.

That is, the gate of the transistor 10 is electrically connected to the one electrode of the capacitor 30 in FIGS. 20A and 20B and FIGS. 21A and 21B.

Figure 20A:
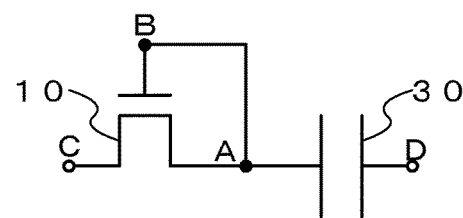
FIGS. 20A and 20B illustrate an example of a semiconductor device including a circuit element having at least one capacitor and one transistor.
Figure 20B:
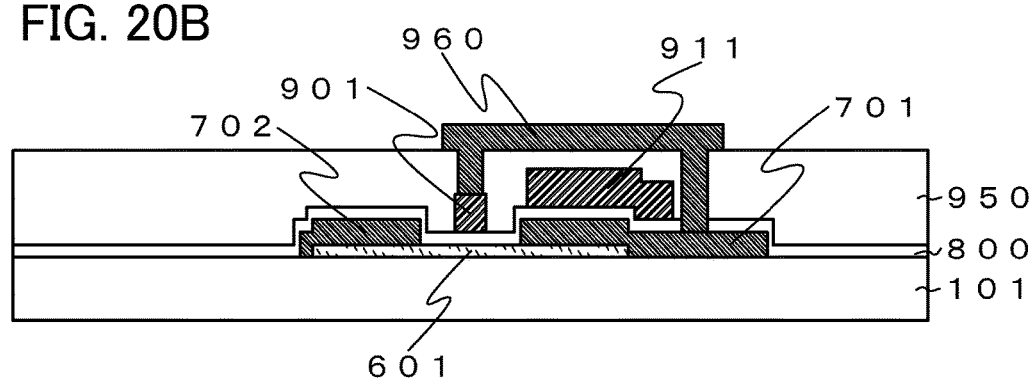

Here, FIG. 20B is an example of a cross-sectional view of a semiconductor device illustrated in FIG. 20A.

Figure 21A:
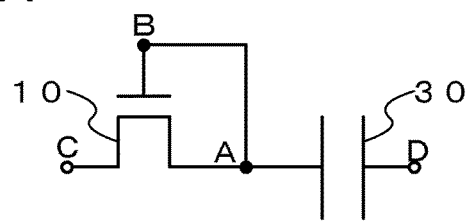
FIGS. 21A and 21B illustrate an example of a semiconductor device including a circuit element having at least one capacitor and one transistor.
Figure 21B:
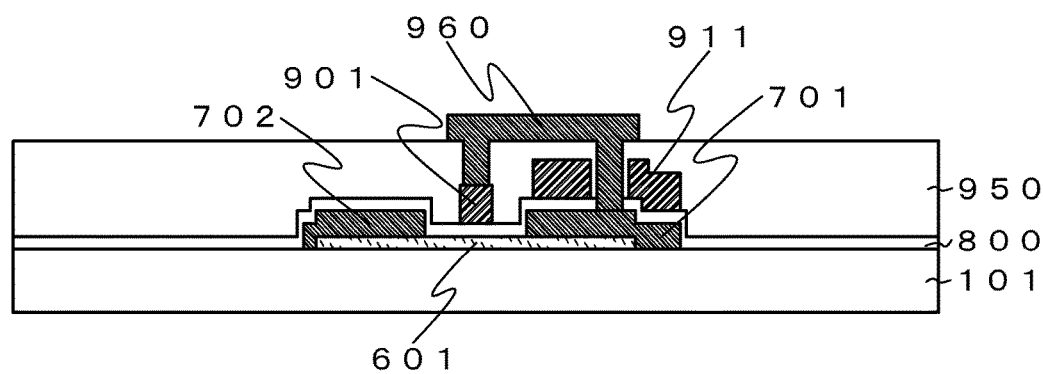

FIG. 21B is an example of a cross-sectional view of a semiconductor device illustrated in FIG. 21A.

FIG. 20B differs from FIG. 19B in that the conductive layer 960 is provided over the insulating layer 950.

FIG. 21B differs from FIG. 19B in that the conductive layer 960 is provided over the insulating layer 950.

The gate of the transistor 10 (the conductive layer 901) is electrically connected to the one electrode of the capacitor 30 (the conductive layer 701 (common electrode)) through the conductive layer 960.

Further, the conductive layer 960 is electrically connected to the conductive layer 901 through a contact hole provided in the insulating layer 950.

In FIG. 20B, the conductive layer 960 is electrically connected to the conductive layer 701 through a contact hole provided in the insulating layer 950 and the insulating layer 800.

In FIG. 20B, the area of the conductive layer 701 is increased in order that a contact region where a contact hole is formed is secured.

On the other hand, in FIG. 21B, the conductive layer 960 is electrically connected to the conductive layer 701 through an opening portion provided in the conductive layer 911 and a contact hole provided in the insulating layer 950 and the insulating layer 800.

The conductive layer 960 is an electrode or a wiring.

The contact region can be provided so as not to overlap with the semiconductor layer 601 as in FIG. 20B. However, the contact region is preferably provided so as to overlap with the semiconductor layer 601 as in FIG. 21B.

This is because the resistance value of the conductive layer 960 is proportional to the distance between the conductive layer 901 and the contact region.

Since the distance between the conductive layer 901 and the contact region in FIG. 21B is shorter than the distance between the conductive layer 901 and the contact region in FIG. 20B, the resistance value of the conductive layer 960 in FIG. 21B can be lower than the resistance value of the conductive layer 960 in FIG. 20B.

Thus, it can be said that the case of FIG. 20B is preferable to the case of FIG. 21B in terms of reduction in the resistance value of the conductive layer 960.

In the case where the conductive layer 960 is in contact with the conductive layer 911, the node A is electrically connected to the node D, which results in malfunction of the capacitor 30. Thus, a connection between the conductive layer 960 and the conductive layer 911 needs to be prevented.

As a result, the opening portion provided in the conductive layer 911 is preferably slightly larger than the contact hole provided in the insulating layer 950 and the insulating layer 800.

Figure 22A:
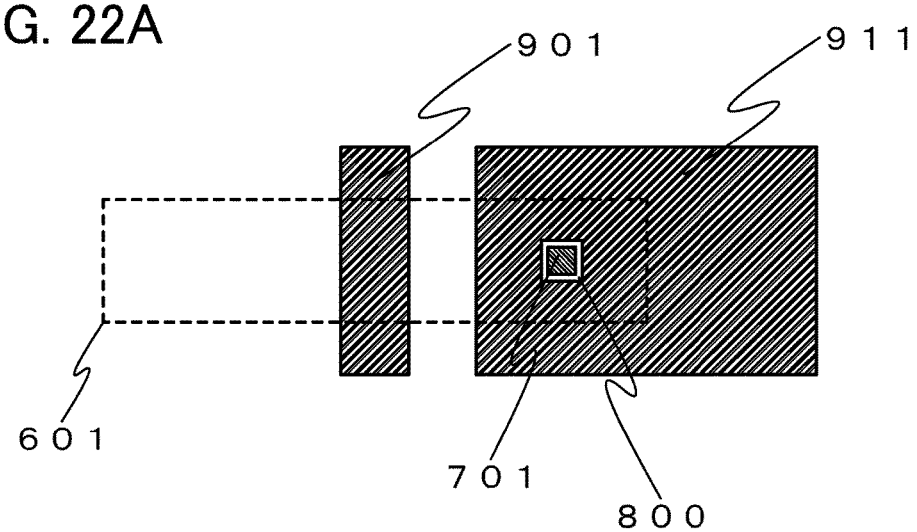
FIG. 22A illustrates an example of a positional relation of the semiconductor layer 601, the conductive layer 701, an insulating layer 800, a conductive layer 901, and a conductive layer 911
Figure 23A:
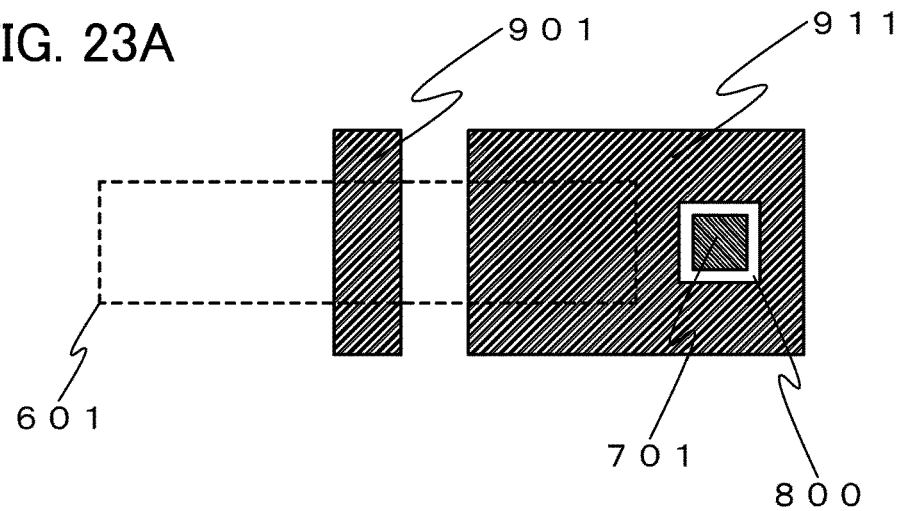
FIG. 23A illustrates an example of a positional relation of the semiconductor layer 601, the conductive layer 701, the insulating layer 800, the conductive layer 901, and the conductive layer 911.
Figure 24A:
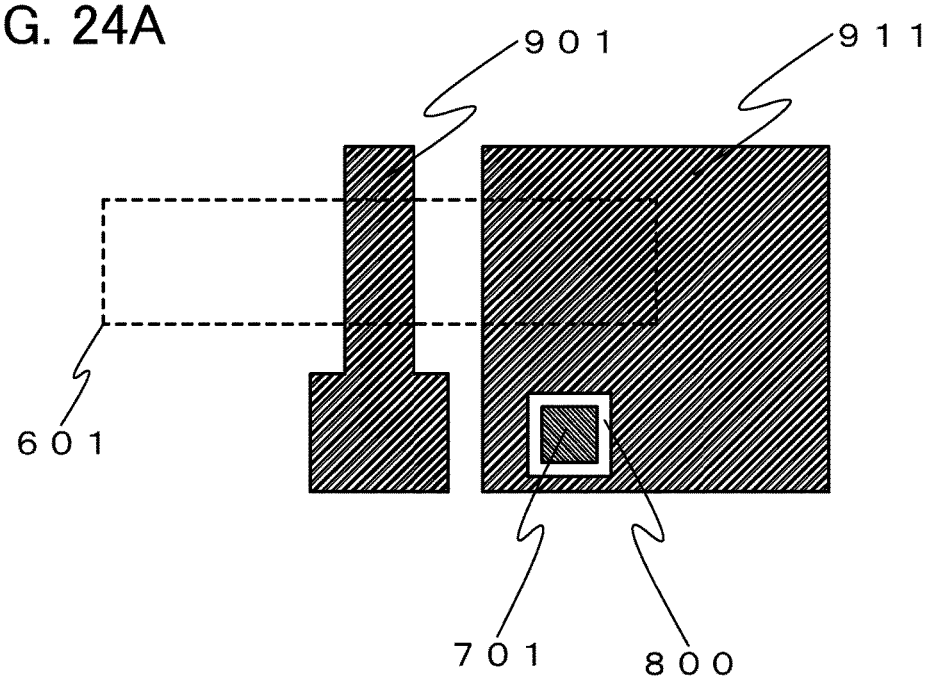
FIG. 24A illustrates an example of a positional relation of the semiconductor layer 601, the conductive layer 701, the insulating layer 800, the conductive layer 901, and the conductive layer 911.

Here, FIG. 22A, FIG. 23A, and FIG. 24A each illustrate an example of a positional relation of the semiconductor layer 601, the conductive layer 701, the insulating layer 800, the conductive layer 901, and the conductive layer 911.

Figure 22B:
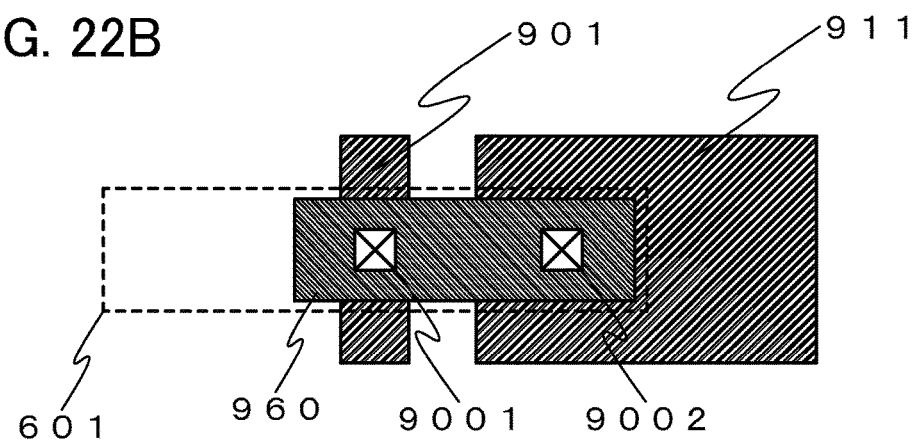
FIG. 22B illustrates an example of a positional relation of the semiconductor layer 601, the conductive layer 901, the conductive layer 911, a conductive layer 960, a contact hole 9001, and an opening portion 9002.
Figure 23B:
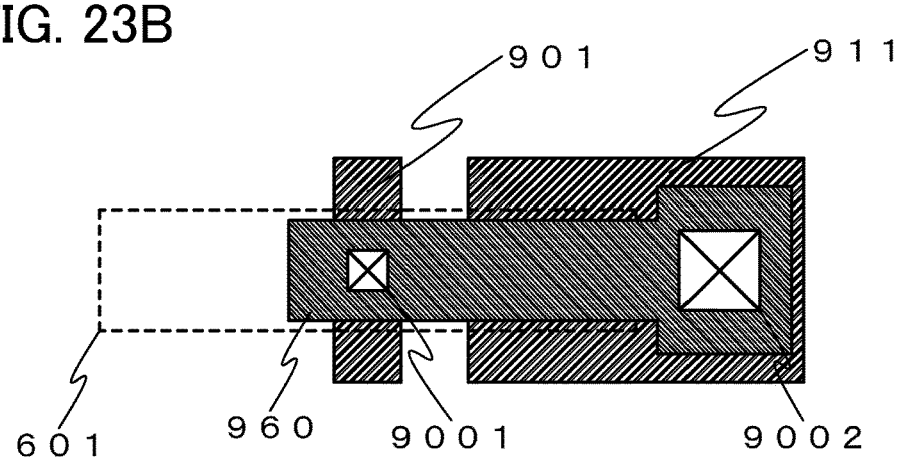
FIG. 23B illustrates an example of a positional relation of the semiconductor layer 601, the conductive layer 901, the conductive layer 911, the conductive layer 960, the contact hole 9001, and the opening portion 9002.
Figure 24B:
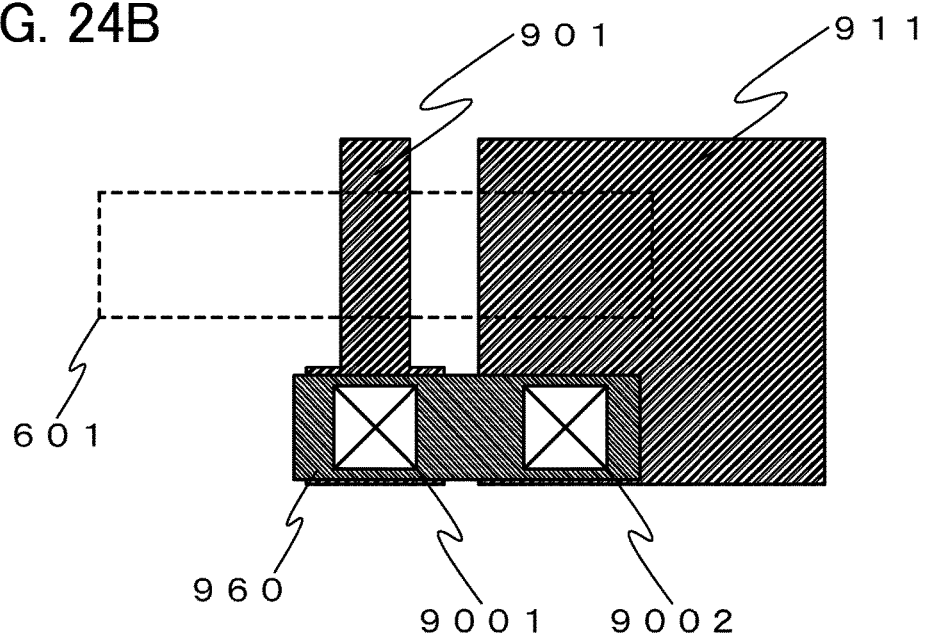
FIG. 24B illustrates an example of a positional relation of the semiconductor layer 601, the conductive layer 901, the conductive layer 911, the conductive layer 960, the contact hole 9001, and the opening portion 9002.

FIG. 22B, FIG. 23B, and FIG. 24B each illustrate an example of a positional relation of the semiconductor layer 601, the conductive layer 901, the conductive layer 911, the conductive layer 960, a contact hole 9001, and an opening portion 9002.

Figure 23C:
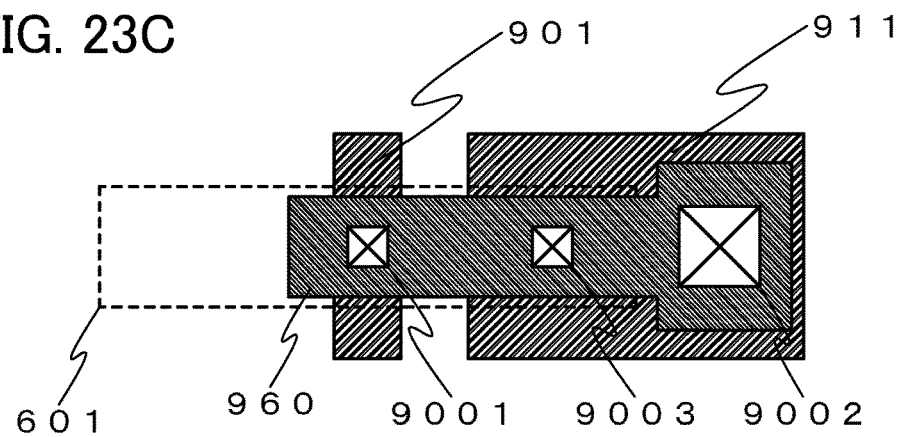
FIG. 23C illustrates an example of a positional relation of the semiconductor layer 601, the conductive layer 901, the conductive layer 911, the conductive layer 960, the contact hole 9001, the opening portion 9002, and an opening portion 9003.

FIG. 23C illustrates an example of a positional relation of the semiconductor layer 601, the conductive layer 901, the conductive layer 911, the conductive layer 960, the contact hole 9001, the opening portion 9002, and an opening portion 9003.

Note that since the insulating layer 800 is provided over the semiconductor layer 601 in FIGS. 22A and 22B, FIGS. 23A to 23C, and FIGS. 24A and 24B, the semiconductor layer 601 is shown by a dashed line.

FIG. 22B, FIG. 23B, and FIG. 24B show positions of the contact hole 9001 provided in the insulating layer 950 and the opening portion 9002 provided in the conductive layer 911.

FIG. 23C show positions of the contact hole 9001 provided in the insulating layer 950, the opening portion 9002 provided in the conductive layer 911, and the opening portion 9003 provided in the conductive layer 911.

In FIG. 22B, the contact hole 9001 and the opening portion 9002 are provided so as to overlap with the semiconductor layer 601.

In FIGS. 23B and 23C, the contact hole 9001 is provided so as to overlap with the semiconductor layer 601 and the opening portion 9002 is provided so as not to overlap with the semiconductor layer 601.

In FIG. 24B, the contact hole 9001 and the opening portion 9002 are provided so as not to overlap with the semiconductor layer 601.

In FIG. 22B and FIG. 23B, the conductive layer 960 is provided so as to overlap with the semiconductor layer 601.

On the other hand, in FIG. 24B, the conductive layer 960 is provided so as not to overlap with the semiconductor layer 601.

The cases of FIG. 22B and FIG. 23B are superior to the case of FIG. 24B in that an area occupied by a cell including the conductive layer 960 can be reduced.

The cases of FIG. 22B and FIG. 24B are preferable to the case of FIG. 23B because the length of the conductive layer 960 can be shortened, which leads to a reduction in wiring resistance.

As described above, the structures in FIG. 22B, FIG. 23B, and FIG. 24B each have an advantage. Thus, it is preferable that the structures be selected as appropriate depending on the purpose.

A plurality of opening portions is preferably provided in the conductive layer 911 because the number of contact portions of the conductive layer 960 and the conductive layer 701 can be increased and the contact resistance between the conductive layer 960 and the conductive layer 701 can be decreased.

For example, FIG. 23C is an example in which the opening portion 9003 is added to the structure in FIG. 23B in a position overlapping with the semiconductor layer 601.

Since the opening portion 9002 and the opening portion 9003 are provided in the conductive layer 911 in FIG. 23C, the number of the contact portions of the conductive layer 960 and the conductive layer 701 can be increased.

Further, since the opening portion 9002 and the opening portion 9003 are provided in the conductive layer 911 in FIG. 23C, both of the advantages of FIG. 22B and FIG. 23B can be obtained.

Furthermore, the structure in FIG. 23C is preferable because the wiring resistance can be further decreased as compared to the structure in FIG. 23B.

Note that when the contact hole 9001, the opening portion 9002, and the opening portion 9003 are provided in one line as in FIG. 23C, the conductive layer 960 can be provided so as to overlap with the semiconductor layer 601 and the conductive layer 911.

The conductive layer 960 preferably overlaps with the semiconductor layer 601 and the conductive layer 911 because an area occupied by a cell can be reduced.

Further, this embodiment can also be applied to any semiconductor device that has a transistor formed using a semiconductor layer in a semiconductor substrate (e.g., a silicon wafer).

Furthermore, this embodiment can be applied to a case of a bottom-gate transistor.

In the case where a bottom-gate transistor is manufactured, the insulating layer 800 is provided under the semiconductor layer 601 and the conductive layer 901 is provided under the insulating layer 800.

The contents of this embodiment or part thereof can be implemented in combination with any of the other embodiments and an example.

That is, although an example of a circuit element having one transistor and one capacitor is described in this embodiment, the structures in this embodiment can be applied to a circuit element having two transistors and one capacitor.

Embodiment 19

The conductive layer 701 provided on and in contact with the semiconductor layer 601 is used as a common electrode in Embodiment 18.

Figure 25A:
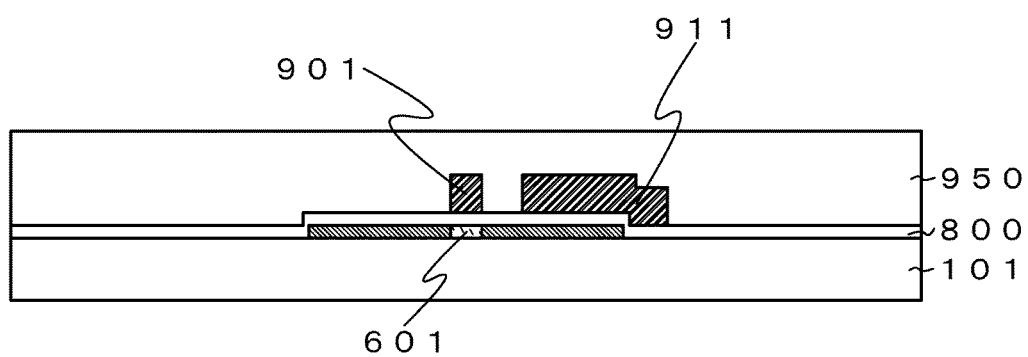
FIGS. 25A to 25C each illustrate an example of a semiconductor device including a circuit element having at least one capacitor and one transistor.
Figure 25B:
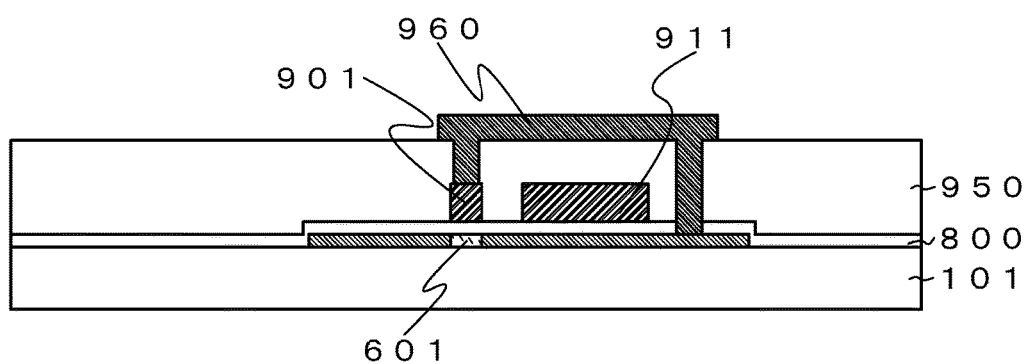
Figure 25C:
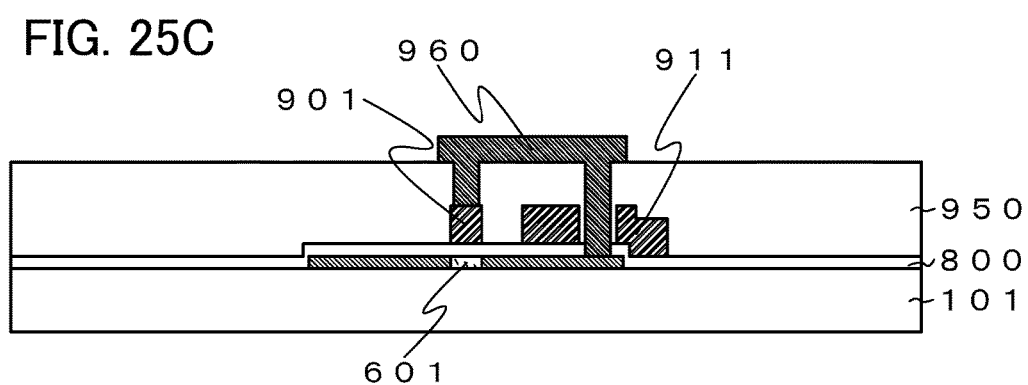

However, the one of the source region and the drain region in the semiconductor layer 601 may be used as a common electrode without the conductive layer 701 as illustrated in FIGS. 25A to 25C.

In the case of FIGS. 25A to 25C, the one of the source region and the drain region in the semiconductor layer 601, the insulating layer 800, and the conductive layer 911, respectively correspond to the one electrode of the capacitor 30, the dielectric layer of the capacitor 30, and the other electrode of the capacitor 30.

Note that a donor element or an acceptor element is preferably added to the source region and the drain region in the semiconductor layer 601 so as to reduce the resistance of the source region and the drain region in the semiconductor layer 601.

Here, FIG. 25A differs from FIG. 19B in that the one of the source region and the drain region in the semiconductor layer 601 serves as a common electrode without the conductive layer 701.

FIG. 25B differs from FIG. 20B in that the one of the source region and the drain region in the semiconductor layer 601 serves as a common electrode without the conductive layer 701.

FIG. 25C differs from FIG. 21B in that the one of the source region and the drain region in the semiconductor layer 601 serves as a common electrode without the conductive layer 701.

The structures in FIG. 25A to 25C are superior to the structures in FIGS. 19A and 19B, FIGS. 20A and 20B, and FIGS. 21A and 21B in that a step of forming the conductive layer 701 can be omitted.

In contrast, the structures in which the conductive layer 701 is provided, which are illustrated in FIGS. 19A and 19B, FIGS. 20A and 20B, and FIGS. 21A and 21B, are superior to the structures in FIGS. 25A to 25C in that the resistance of one of a source and a drain of a transistor is small.

Accordingly, the structures in FIGS. 25A to 25C are preferably employed when a reduction in the number of steps has a high priority, and the structures in which the conductive layer 701 is provided, which are illustrated in FIGS. 19A and 19B, FIGS. 20A and 20B, and FIGS. 21A and 21B, are preferably employed when an improvement of circuit characteristics has a high priority.

In the case where the structure in FIG. 25C is employed, the structures in Embodiment 18 (in particular, in FIGS. 22A and 22B, FIGS. 23A to 23C, FIGS. 24A and 24B, and the like) can be employed for a position of an opening portion provided in the conductive layer 911.

The contents of this embodiment or part thereof can be implemented in combination with any of the other embodiments and an example.

Example 1

A transistor including an oxide semiconductor containing In, Sn, and Zn (In—Sn—Zn-based oxide semiconductor) can have favorable characteristics by deposition of the oxide semiconductor while heating a substrate or by heat treatment after deposition of an oxide semiconductor film.

The oxide semiconductor preferably contains 5 atomic % or more of each of In, Sn, and Zn.

By intentionally heating the substrate after the deposition of the oxide semiconductor film containing In, Sn, and Zn, the field-effect mobility of the transistor can be improved.

Further, the threshold voltage of an N-channel transistor can be shifted in the positive direction.

The positive shift of the threshold voltage of the N-channel transistor makes the absolute value of a voltage used for keeping the N-channel transistor off to decrease, so that power consumption can be reduced.

In addition, when the threshold voltage of the N-channel transistor is positively shifted, and the threshold voltage is greater than or equal to 0 V, a normally-off transistor can be formed.

Characteristics of a transistor formed using an In—Sn—Zn-based oxide semiconductor, which is one of oxide semiconductors, will be described below.

(Common Conditions for Samples A to C)

An oxide semiconductor layer was formed over a substrate to have a thickness of 15 nm under the following conditions: a target having a composition ratio of In:Sn:Zn=1:1:1 (atomic ratio) was used; the gas flow rate was Ar/O$_2$=6/9 sccm; the deposition pressure was 0.4 Pa; and the deposition power was 100 W.

Next, the oxide semiconductor layer was etched in an island shape.

Then, a tungsten layer was deposited over the oxide semiconductor layer to have a thickness of 50 nm and was etched, so that a source electrode and a drain electrode were formed.

Next, a silicon oxynitride film (SiON) was formed as a gate insulating layer to have a thickness of 100 nm by a plasma-enhanced CVD method using silane gas (SiH$_4$) and dinitrogen monoxide (N$_2$O).

Then, a gate electrode was formed in the following manner: a tantalum nitride layer was formed to a thickness of 15 nm; a tungsten layer was formed to a thickness of 135 nm; and the layers were etched.

Further, a silicon oxynitride film (SiON) was formed to a thickness of 300 nm by a plasma-enhanced CVD method and a polyimide film was formed to a thickness of 1.5 μm, thereby forming an interlayer insulating film.

Next, a pad for measurement was formed in the following manner: a contact hole was formed in the interlayer insulating film; a first titanium film was formed to a thickness of 50 nm; an aluminum film was formed to a thickness of 100 nm; a second titanium film was formed to a thickness of 50 nm; and the films were etched.

In this manner, a semiconductor device including a transistor was fabricated.

(Sample A)

In Sample A, intentional heating was not performed on the substrate during the deposition of the oxide semiconductor layer.

Further, in Sample A, heat treatment was not performed after the deposition of the oxide semiconductor layer before the etching of the oxide semiconductor layer.

(Sample B)

In Sample B, the oxide semiconductor layer was deposited with the substrate heated to 200° C.

Further, in Sample B, heat treatment was not performed after the deposition of the oxide semiconductor layer before the etching of the oxide semiconductor layer.

The oxide semiconductor layer was deposited in the state where the substrate was heated in order that hydrogen serving as a donor in the oxide semiconductor layer is removed.

(Sample C)

In Sample C, the oxide semiconductor layer was deposited with the substrate heated to 200° C.

Further, in Sample C, after the oxide semiconductor layer was deposited before the oxide semiconductor layer was etched, heat treatment in a nitrogen atmosphere was performed at 650° C. for 1 hour and then heat treatment was performed in an oxygen atmosphere at 650° C. for 1 hour.

The heat treatment in a nitrogen atmosphere at 650° C. for 1 hour was performed in order that hydrogen serving as a donor in the oxide semiconductor layer is removed.

Oxygen is also removed by the heat treatment for removing hydrogen, which serves as a donor in the oxide semiconductor layer, and an oxygen vacancy serving as a carrier in the oxide semiconductor layer is generated.

Hence, the heat treatment in an oxygen atmosphere was performed at 650° C. for 1 hour to reduce oxygen vacancy.

(Characteristics of transistors of Samples A to C)

Figure 26A:
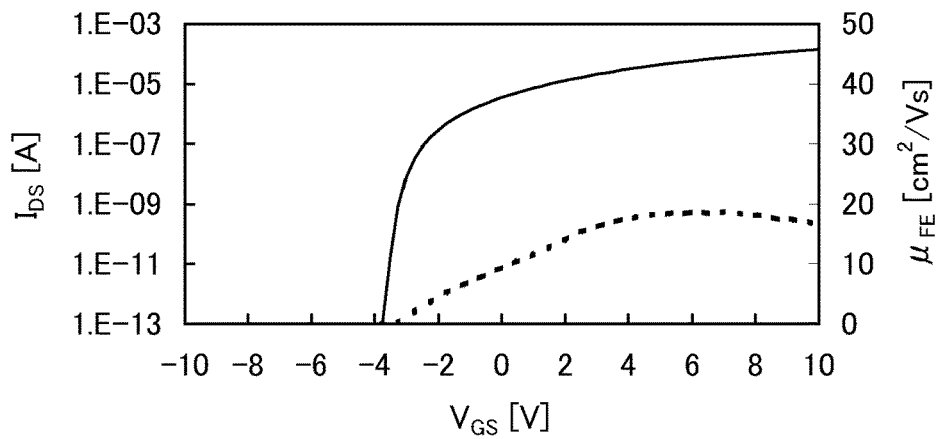
FIGS. 26A to 26C show initial characteristics of samples in Example 1.

FIG. 26A shows initial characteristics of a transistor of Sample A.

Figure 26B:
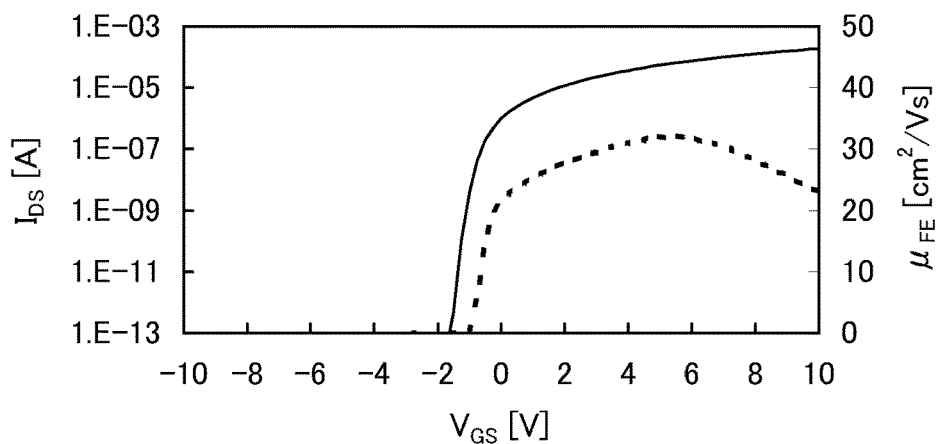

FIG. 26B shows initial characteristics of a transistor of Sample B.

Figure 26C:
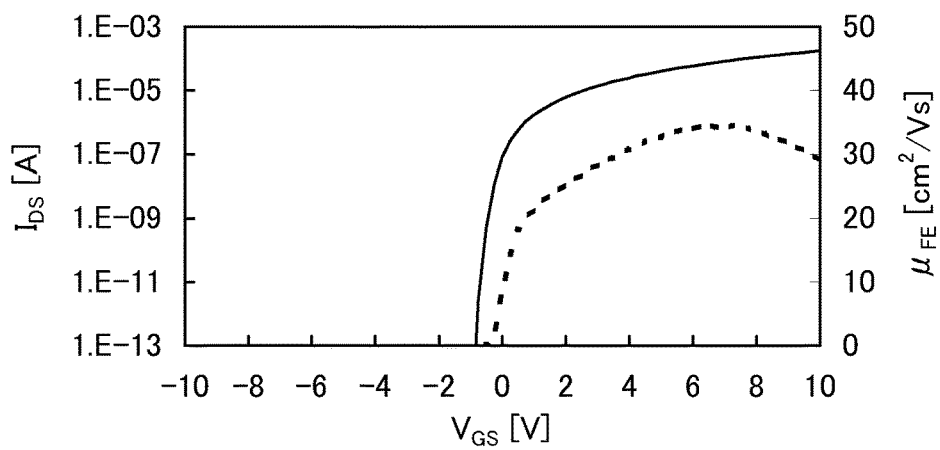

FIG. 26C shows initial characteristics of a transistor of Sample C.

The field-effect mobility of the transistor of Sample A was 18.8 cm$^2$/Vsec.

The field-effect mobility of the transistor of Sample B was 32.2 cm$^2$/Vsec.

The field-effect mobility of the transistor of Sample C was 34.5 cm$^2$/Vsec.

According to observation of cross sections of oxide semiconductor layers, which were formed by deposition methods similar to those of Samples A to C, with a transmission electron microscope (TEM), crystallinity was observed in samples formed by the deposition methods similar to those of Sample B and Sample C, substrates of which were heated during deposition.

Further, surprisingly, the samples, the substrates of which were heated during deposition, had a non-crystalline portion and a crystalline portion having a c-axis crystalline orientation.

In a conventional polycrystal, the crystal orientation in the crystalline portion is not aligned and point in different directions. This means that the samples, the substrates of which were heated during deposition, have a novel structure.

Comparison of FIGS. 26A to 26C shows that heat treatment performed on the substrate during or after deposition can remove an hydrogen element serving as a donor, so that shifting the threshold voltage of the N-channel transistor in the positive direction.

That is, the threshold voltage of Sample B with heating of the substrate during deposition is shifted in the positive direction as compared to the threshold voltage of Sample A without heating of the substrate during deposition.

In addition, it is found from comparison of Sample B and Sample C, the substrates of which were heated during deposition, that the threshold voltage of Sample C with the heat treatment after deposition is more shifted in the positive direction than the threshold voltage of Sample B without the heat treatment after deposition.

As the temperature of heat treatment is higher, a light element such as hydrogen element is removed more easily; thus, hydrogen is more likely to be removed as the temperature of heat treatment is higher.

Accordingly, it is likely that the threshold voltage can be more shifted in the positive direction by further increasing the temperature of the heat treatment during or after deposition.

(Results of Gate BT Stress Tests of Sample B and Sample C)

Gate BT stress tests were performed on Sample B (without heat treatment after deposition) and Sample C (with heat treatment after deposition).

First, the $V_{gs}$–$I_{ds}$ characteristics of transistors were measured at a substrate temperature of 25° C. and $V_{ds}$ of 10 V to measure the characteristics of the transistors before heating and application of high positive voltage.

Next, the substrate temperature was set to 150° C. and $V_{ds}$ was set to 0.1 V.

After that, $V_{gs}$ of 20 V was applied to the gate insulating film and was kept for 1 hour.

Then, $V_{gs}$ was set to 0 V.

Next, the $V_{gs}$–$I_{ds}$ characteristics of the transistors were measured at a substrate temperature of 25° C. and $V_{ds}$ of 10 V to measure the characteristics of the transistors after heating and application of high positive voltage.

Comparison of the characteristics of the transistors before and after heating and application of high positive voltage as described above is referred to as a positive BT test.

On the other hand, first, the $V_{gs}$-$I_{ds}$ characteristics of the transistors were measured at a substrate temperature of 25° C. and $V_{ds}$ of 10 V to measure the characteristics of the transistors before heating and application of high negative voltage.

Next, the substrate temperature was set to 150° C. and $V_{ds}$ was set to 0.1 V.

After that, $V_{gs}$ of −20 V was applied to the gate insulating film and was kept for 1 hour.

Then, $V_{gs}$ was set to 0 V.

Next, the $V_{gs}$-$I_{ds}$ characteristics of the transistors were measured at a substrate temperature of 25° C. and $V_{ds}$ of 10 V to measure the characteristics of the transistors after heating and application of high negative voltage.

Comparison of the characteristics of the transistors before and after heating and application of high negative voltage as described above is referred to as a negative BT test.

Figure 27A:
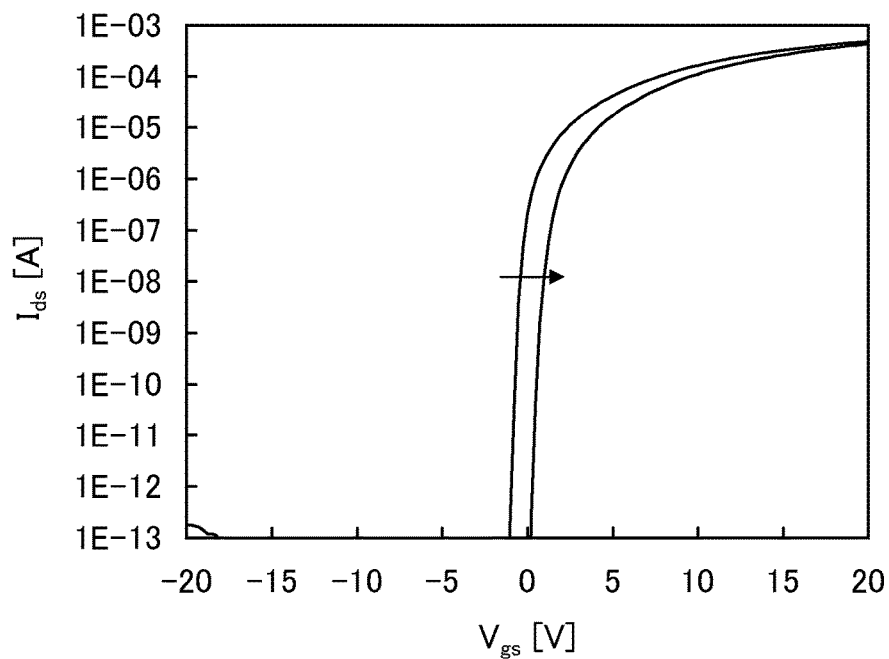
FIGS. 27A and 27B show results of BT tests of the sample in Example 1.
Figure 27B:
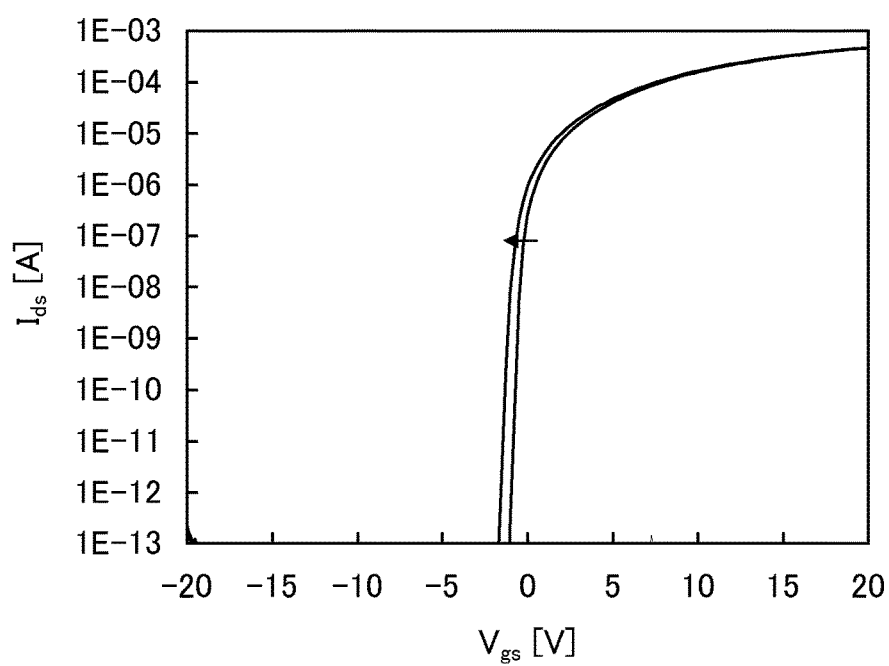

FIG. 27A shows the result of the positive BT test of Sample B. FIG. 27B shows the result of the negative BT test of Sample B.

Figure 28A:
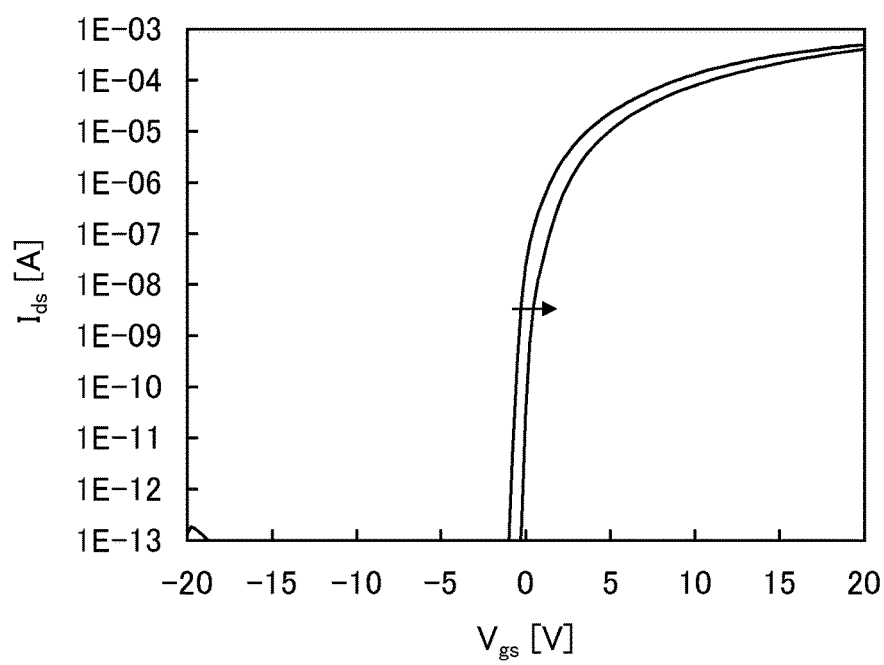
FIGS. 28A and 28B show results of BT tests of the sample in Example 1.
Figure 28B:
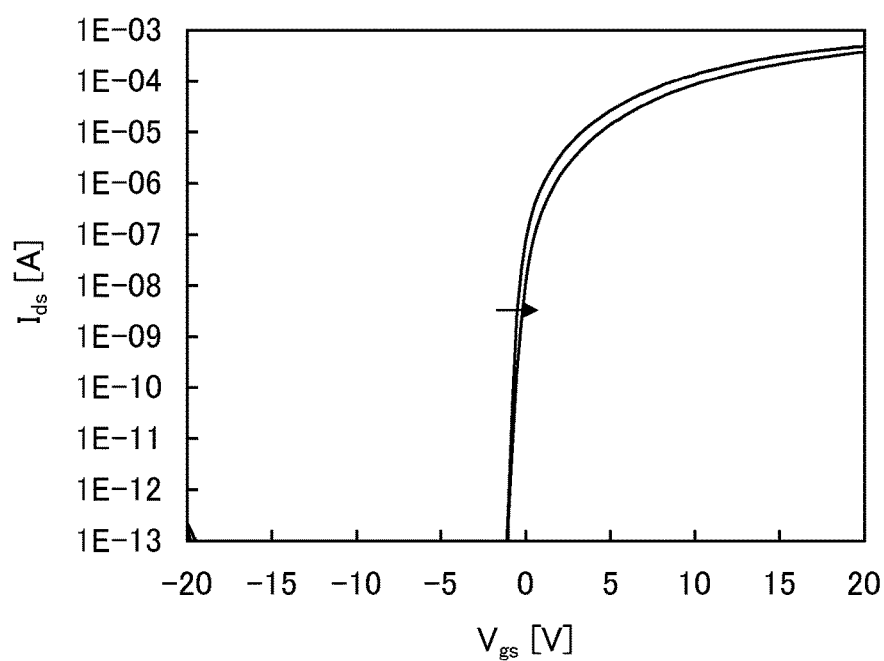

FIG. 28A shows the result of the positive BT test of Sample C. FIG. 28B shows the result of the negative BT test of Sample C.

Although the positive BT test and the negative BT test are tests for determining the deterioration degree of a transistor, it is found from FIG. 27A and FIG. 28A that the threshold voltage can be shifted in the positive direction by performing at least the positive BT test.

In particular, FIG. 27A reveals that the positive BT test made the transistor a normally-off transistor.

Thus, performing the positive BT test in addition to the heat treatment in the manufacturing process of the transistor makes it possible to promote a shift of the threshold voltage in the positive direction and consequently a normally-off transistor can be manufactured.

Figure 29:
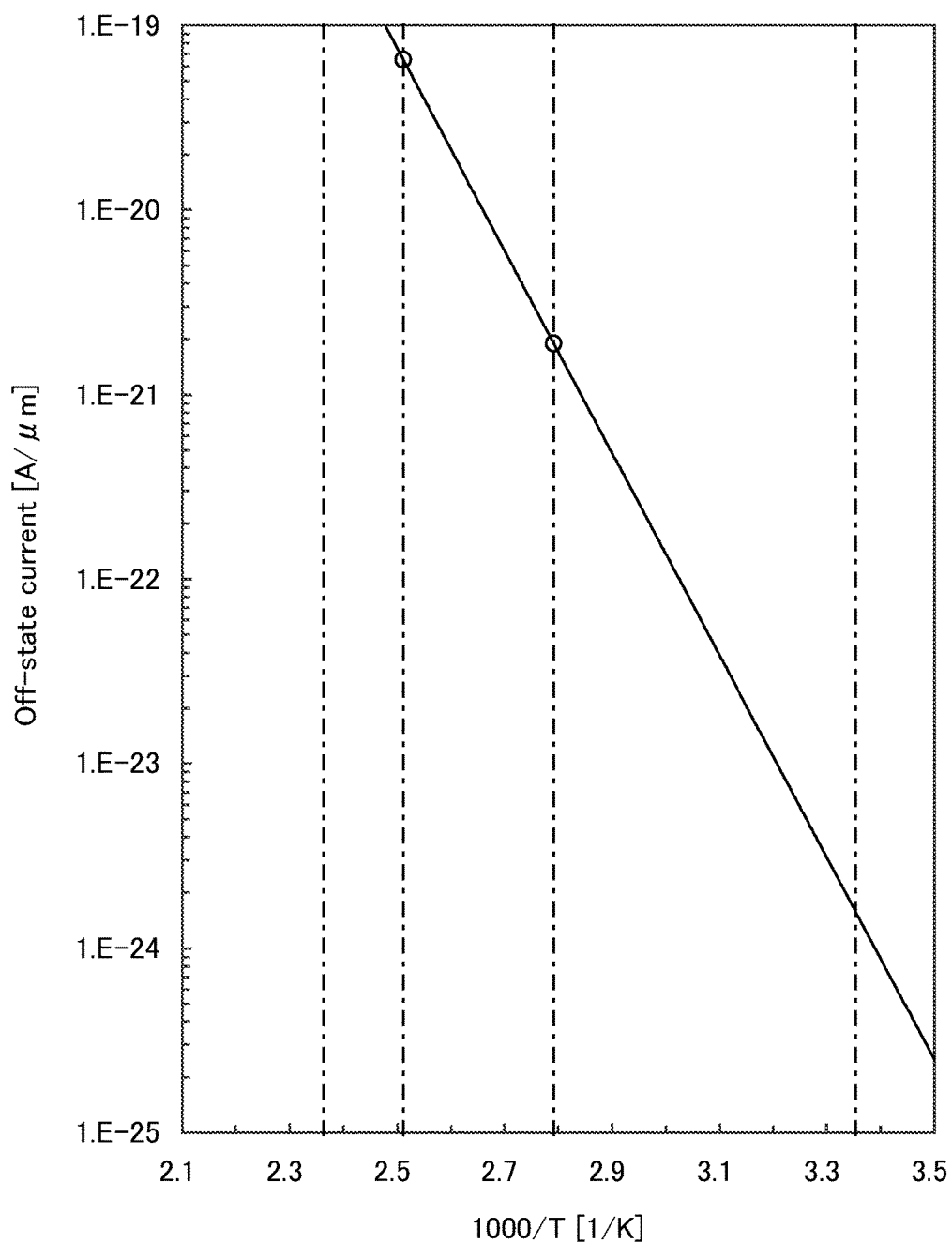
FIG. 29 shows a relation between off-state current and a substrate temperature during measurement.

FIG. 29 shows the relation between the off-state current of the transistor of Sample A and the inverse of the substrate temperature (absolute temperature) at measurement.

In FIG. 29, the horizontal axis represents a value (1000/T) obtained by multiplying the inverse of the substrate temperature at measurement by 1000.

The amount of off-state current per micrometer in the channel width is shown in FIG. 29.

The off-state current was less than or equal to $1 \times 10^{-19}$ A at a substrate temperature of 125° C. (1000/T is about 2.51).

The off-state current was less than or equal to $1 \times 10^{-20}$ A at a substrate temperature of 85° C. (1000/T is about 2.79).

In other words, it was found that the off-state current of the transistor including an oxide semiconductor is extremely low as compared to a transistor including a silicon semiconductor.

The off-state current is decreased as the temperature decreases; thus, it is clear that the off-state current at ordinary temperature is still lower.

This application is based on Japanese Patent Application serial no. 2011-123521 filed with Japan Patent Office on Jun. 1, 2011, the entire contents of which are hereby incorporated by reference.

What is claimed is:

1. A semiconductor device comprising:
   a first transistor comprising a semiconductor layer, a gate, a first electrode, and an insulating layer between the semiconductor layer and the gate;
   a second transistor; and
   a capacitor comprising the first electrode, a second electrode, and the insulating layer between the first electrode and the second electrode,
   wherein the first electrode is a common electrode serving as one of a source and a drain of the first transistor and the first electrode of the capacitor,
   wherein the common electrode is electrically connected to a gate of the second transistor through an opening provided in the semiconductor layer of the first transistor,
   wherein the common electrode and the second transistor partly overlap with each other, and
   wherein the second electrode is over the common electrode.

2. The semiconductor device according to claim 1, wherein the common electrode is electrically connected to the gate of the second transistor through the opening and a second opening provided in the semiconductor layer of the first transistor.

3. The semiconductor device according to claim 1, wherein the semiconductor layer of the first transistor and a semiconductor layer of the second transistor overlap with each other.

4. The semiconductor device according to claim 1, wherein the second electrode overlaps with the common electrode and the semiconductor layer of the first transistor.

5. The semiconductor device according to claim 1,
   wherein the second transistor comprises a gate insulating film, and
   wherein the second electrode is over the gate insulating film.

6. A semiconductor device comprising:
   a first transistor comprising a semiconductor layer, a gate, a first electrode, and an insulating layer between the semiconductor layer and the gate;
   a second transistor; and
   a capacitor comprising the first electrode, a second electrode, and the insulating layer between the first electrode and the second electrode,
   wherein one of a source and a drain of the first transistor is electrically connected to one of a source and a drain of the second transistor,
   wherein the first electrode and the second transistor partly overlap with each other,
   wherein the one of the source and the drain of the first transistor serves as the first electrode of the capacitor,
   wherein the second electrode is over the first electrode,
   wherein the gate of the first transistor is electrically connected to the one of the source and the drain of the first transistor using a wiring provided over the second electrode, and
   wherein the wiring is electrically connected to the one of the source and the drain of the first transistor through an opening provided in the second electrode.

7. The semiconductor device according to claim 6, wherein the one of the source and the drain of the first transistor is electrically connected to the one of the source and the drain of the second transistor through an opening provided in the semiconductor layer of the first transistor.

8. The semiconductor device according to claim 6, wherein the one of the source and the drain of the first transistor is electrically connected to the one of the source and the drain of the second transistor through a plurality of openings provided in the semiconductor layer of the first transistor.

9. The semiconductor device according to claim 6, wherein the semiconductor layer of the first transistor overlaps with a semiconductor layer of the second transistor.

10. The semiconductor device according to claim 6, wherein the second electrode overlaps with the one of the source and the drain of the first transistor and the semiconductor layer of the first transistor.

11. A semiconductor device comprising:
a transistor comprising a common electrode, a gate, and a semiconductor layer;
a capacitor comprising the common electrode and an electrode over the common electrode; and
a wiring over the electrode,
wherein the gate of the transistor is electrically connected to the wiring,
wherein the wiring is electrically connected to the common electrode through an opening provided in the electrode, and
wherein the opening overlaps with the semiconductor layer.

12. The semiconductor device according to claim 11, further comprising an insulating layer over the electrode,
wherein the common electrode is in contact with the semiconductor layer,
wherein the electrode is over the common electrode, and
wherein the wiring is over the insulating layer.

13. The semiconductor device according to claim 11,
wherein the common electrode is in contact with the semiconductor layer, and
wherein the common electrode serves as one of a source and a drain of the transistor.

* * * * *